US012525922B2

(12) United States Patent
Ishihara

(10) Patent No.: US 12,525,922 B2
(45) Date of Patent: Jan. 13, 2026

(54) OVER TEMPERATURE PROTECTION WITH SOFT SHUTDOWN FOR POWER AMPLIFIER

(71) Applicant: pSemi Corporation, San Diego, CA (US)

(72) Inventor: Shota Ishihara, San Diego, CA (US)

(73) Assignee: PSEMI CORPORATION, San Diego, CA (US)

( * ) Notice: Subject to any disclaimer, the term of this patent is extended or adjusted under 35 U.S.C. 154(b) by 746 days.

(21) Appl. No.: 17/821,731

(22) Filed: Aug. 23, 2022

(65) Prior Publication Data

US 2024/0072731 A1    Feb. 29, 2024

(51) Int. Cl.
  *H03F 1/02*    (2006.01)
  *H03F 1/30*    (2006.01)
  *H03F 3/24*    (2006.01)

(52) U.S. Cl.
  CPC ........... *H03F 1/0216* (2013.01); *H03F 1/302* (2013.01); *H03F 3/245* (2013.01);
  (Continued)

(58) Field of Classification Search
  CPC ........ H03F 1/0216; H03F 1/302; H03F 3/245; H03F 2200/447; H03F 2200/451;
  (Continued)

(56) References Cited

U.S. PATENT DOCUMENTS 6,166,530 A    12/2000  D'Angelo
6,525,611 B1    2/2003  Dening et al.
          (Continued)

FOREIGN PATENT DOCUMENTS

KR    20110129836 A    12/2011
WO      98/21820 A1     5/1998
          (Continued)

OTHER PUBLICATIONS

Corrected Notice of Allowability for U.S. Appl. No. 16/669,384, filed Oct. 30, 2019 on behalf of pSemi Corporation. Mail Date: Mar. 1, 2021. 4 pages.
(Continued)

*Primary Examiner* — Andrea Lindgren Baltzell
*Assistant Examiner* — Jose E Pinero
(74) *Attorney, Agent, or Firm* — Steinfl + Bruno LLP

(57) ABSTRACT

Various methods and circuital arrangements for protection of a power amplifier from over temperature are presented. According to one aspect, a protection circuit coupled to a temperature sensor controls a biasing current or voltage to the power amplifier to limit a power dissipation through, and therefore a temperature of, the power amplifier when a high limit temperature is sensed. When the high limit temperature is sensed, the biasing current or voltage decreases as a linear function of the sensed temperature while allowing the power amplifier to operate. A slope of the linear function and a value of the high limit temperature can be made programmable. Programmability of the slope and the high limit temperature can be used to control biasing currents or voltages to a plurality of power amplifiers operating at different times and having different thermal requirements.

23 Claims, 20 Drawing Sheets

(52) U.S. Cl.
CPC .. *H03F 2200/447* (2013.01); *H03F 2200/451* (2013.01); *H03F 2200/468* (2013.01)

(58) Field of Classification Search
CPC ......... H03F 2200/468; H03F 2200/411; H03F 1/223; H03F 1/52; H03F 1/523; H03F 3/19
USPC .......................................................... 330/289
See application file for complete search history.

(56) References Cited

U.S. PATENT DOCUMENTS

| | | | |
|---|---|---|---|
| 7,605,651 B2 | 10/2009 | Ripley et al. | |
| 8,368,355 B2 | 2/2013 | Tam | |
| 8,487,705 B2 | 7/2013 | Yao et al. | |
| 9,413,298 B2 | 8/2016 | Nobbe et al. | |
| 9,876,478 B2 | 1/2018 | Modi et al. | |
| 10,153,737 B2 * | 12/2018 | Ishihara | H03F 1/30 |
| 10,965,255 B1 * | 3/2021 | Ishihara | H03F 3/211 |
| 12,034,410 B2 | 7/2024 | Ishihara | |
| 2002/0183021 A1 | 12/2002 | Brandt | |
| 2006/0197594 A1 | 9/2006 | Scuderi et al. | |
| 2009/0206933 A1 | 8/2009 | Prikhodko et al. | |
| 2010/0329304 A1 * | 12/2010 | Doorenbos | H03F 1/302 374/178 |
| 2011/0221533 A1 | 9/2011 | Lesso | |
| 2011/0279185 A1 | 11/2011 | Lautzenhiser | |
| 2011/0292554 A1 | 12/2011 | Yao et al. | |
| 2012/0313709 A1 | 12/2012 | Lautzenhiser | |
| 2015/0333711 A1 | 11/2015 | Langer | |
| 2016/0072452 A1 | 3/2016 | Ripley et al. | |
| 2016/0241200 A1 | 8/2016 | Nadimpalli et al. | |
| 2017/0026008 A1 * | 1/2017 | Hong | H03F 1/0261 |
| 2019/0267948 A1 | 8/2019 | Su et al. | |
| 2019/0348959 A1 | 11/2019 | Lasser et al. | |
| 2021/0075376 A1 * | 3/2021 | Birkbeck | H03F 1/0272 |
| 2021/0234523 A1 * | 7/2021 | Morisawa | H03F 3/245 |
| 2022/0182016 A1 | 6/2022 | Ranta et al. | |
| 2022/0239261 A1 | 7/2022 | Ishihara | |
| 2024/0162864 A1 | 5/2024 | Ishihara et al. | |
| 2024/0322762 A1 | 9/2024 | Ishihara | |

FOREIGN PATENT DOCUMENTS

| | | |
|---|---|---|
| WO | 03/030328 A1 | 4/2003 |
| WO | 2021/086755 A1 | 5/2021 |
| WO | 2024/044049 A1 | 2/2024 |
| WO | 2024/107600 A1 | 5/2024 |

OTHER PUBLICATIONS

International Preliminary Report on Patentability issued for International PCT Application No. PCT/US2020/057171 filed on Oct. 23, 2020, on behalf of pSemi Corporation. Mail Date: May 12, 2022. 6 Pages.

International Search Report and Written Opinion for International PCT Application No. PCT/US2020/057171filed on Oct. 23, 2020, on behalf of pSemi Corporation. Mail Date: Feb. 10, 2021. 9 Pages.

Notice of Allowance for U.S. Appl. No. 16/669,384, filed Oct. 30, 2019 on behalf of pSemi Corporation. Mail Date: Nov. 25, 2020. 9 pages.

International Search Report and Written Opinion issued for International Application No. PCT/US2023/029994 filed on Aug. 10, 2023 on behalf of Psemi Corporation. Mail Date: Nov. 16, 2023. 16 pages.

Van Bezooijen, A., et al., "Over-Temperature Protection by Adaptive Output Power Control," The 9th European Conference on Wireless Technology, IEEE, Piscatawey, NJ, US, Sep. 10, 2006. pp. 350-352. XP031005314.

International Search Report and Written Opinion for International Application No. PCT/US2023/079343 filed on Nov. 10, 2023 on behalf of Psemi Corporation Mail Date: Apr. 8, 2024 10 pages.

Notice of Allowance issued for U.S. Appl. No. 17/719,291, filed Apr. 12, 2022 on behalf of pSemi Corporation. Mail Date: Mar. 20, 2024. 10 Pages.

* cited by examiner

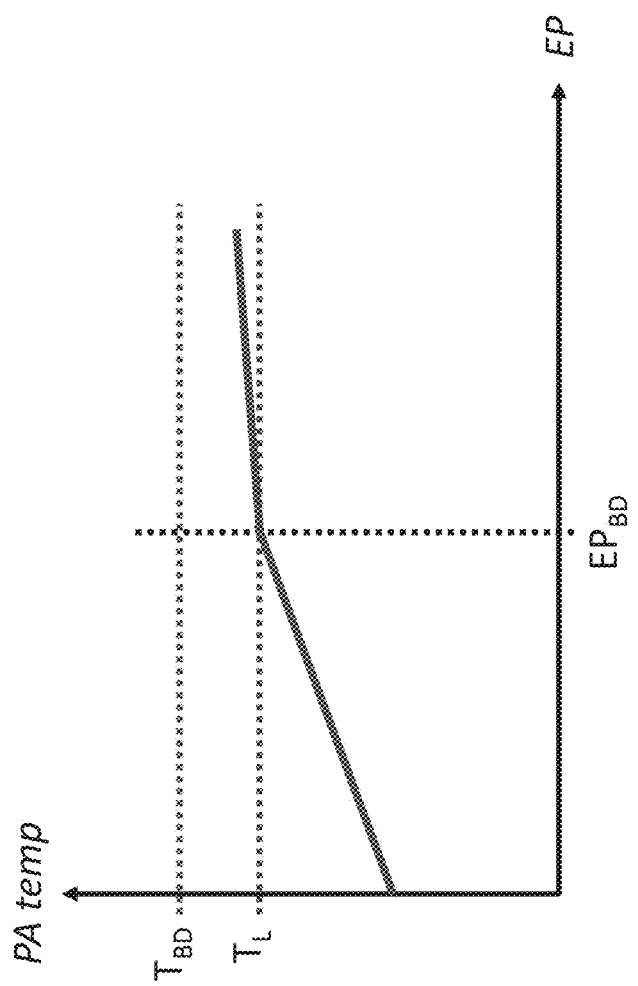

OVER TEMPERATURE PROTECTION WITH SOFT SHUTDOWN FOR POWER AMPLIFIER

TECHNICAL FIELD

The present application relates to amplifiers. In particular, the present application relates to over temperature protection of power amplifiers (PAs).

BACKGROUND

FIG. 1 shows a prior art radio frequency (RF) power amplifier (PA) module (110) which can be used, for example, in a transmitter section of an RF front-end communication system, such as for example, a mobile communication system. As shown in the configuration (100A) of FIG. 1, the power amplifier module (110) can include a number of cascaded amplifier stages (e.g., 112, 113), coupled in series connection via matching networks (e.g., MN1, MN2, MN3), for amplification of an input RF signal, RFin, to generate therefrom an amplified output RF signal, RFout. Power to the amplifier stages (112, 113) is provided via a supply voltage, Vcc, that is referenced to a reference ground, Vgnd, the supply voltage coupled to the amplifier stages (112, 113) through respective inductors (L2, L3). The amplified signal, RFout, can in turn be transmitted via, for example, an antenna that is coupled to the PA module through an antenna switch (e.g., elements 740 and 750 per FIG. 7 later described).

As shown in FIG. 1, an input stage of each of the amplifier stages (112, 113) may include a respective common-emitter transistor (Tr12, Tr13) whose base receives the input RF signal which is amplified by the common-emitter transistor (Tr21, Tr13) and output at a respective collector of the transistor (e.g., details in lower right corner of the figure), the collector being coupled to the supply voltage, Vcc, through a respective inductor (L2, L3), and coupled to a respective output of the amplifier stages (112, 113). Amplification through each of the amplifier stages (112, 113), and therefore through the PA module (110), may be based on biasing of the amplifier stages (112, 113) to establish operating points (i.e., bias points) of the common-emitter transistors (Tr12, Tr13). As can be seen in FIG. 1, such biasing is provided via a biasing circuit (120) that includes emitter-follower transistors (Tr22, Tr23) coupled to respective inputs of the amplifier stages (112, 113). The emitter of each of the emitter-follower transistors (Tr22, Tr23) is coupled to a base of a respective common-emitter transistor (Tr21, Tr23) through a series connected resistor (R12, R13) that is known in the art as a "ballast" resistor. Accordingly, the biasing circuit (120) provides a biasing signal, that can be considered as a biasing voltage or a biasing current, to each of the amplification stages (112, 113).

With continued reference to FIG. 1, the biasing circuit (120) may generate the biasing signals under control of a controller circuit (130) that may include a control/interface circuit (132) to receive commands from, for example, a signal aware processor, such as, for example, a transceiver circuit, and translate such commands to control signals to generate corresponding biasing signals for biasing of the PA module (110). In the exemplary prior art case shown in FIG. 1, a digital-to-analog (DAC) converter (135) is used to generate the control signals (i.e., currents or voltages) to the emitter-follower transistors (Tr22, Tr23) of the biasing circuit (120). For example, as shown in FIG. 1, the DAC converter (135) may provide a voltage to the base of each of the emitter-follower transistors (Tr22, Tr23) so that a desired biasing signal can be output at the emitter of each such transistor for biasing of the PA module (110). Series connected diodes pairs (D21, D22) and (D31, D32) coupled between the reference ground, Vgnd, and base of respective emitter-follower transistors (Tr22, Tr23) can be used to counter thermal variation of the common-emitter transistors (Tr12, Tr13) and prevent, in some cases, thermal runaway as known in the art, of the common-emitter transistors (Tr12, Tr13).

As shown in the graphs of FIG. 2, temperature (PA temp) of the PA module (110) may be an increasing function of its output power ($P_{OUT}$), but may also be a function of external parameters (EP), such as, for example, ambient temperature or other (e.g., transceiver operation) which may in turn affect other parameters that may also be considered as external parameters to the PA module (110), such as levels of the supply voltage, Vcc, the input RF signal, RFin, input/output matching conditions, etc. As shown in FIG. 2, when operating at a first output power, $P_{OUT1}$, the temperature, PA temp, may be an increasing function of (one or more levels of) the external parameters, EP, but without reaching a breakdown temperature, $T_{BD}$, of the PA module (110). On the other hand, when operating at a second output power, $P_{OUT2}$, that is higher than the first output power, $P_{OUT1}$, the temperature, PA temp, may be an increasing function of (one or more levels of) the external parameters, EP, while reaching the breakdown temperature, $T_{BD}$, of the PA module (110) at an external parameter level/value represented in FIG. 2 by $EP_{BD}$. In other words, for some output power range of operation of the PA module (110), variations of levels of the external parameters may cause breakdown of the PA module (110) due to over temperature conditions.

Some prior art solutions for over temperature protection of a power amplifier (PA) may be based on a hard shutdown of the PA that inhibits operation of the PA. Although such prior art hard shutdown schemes may be effective in protecting the amplifier module against breakdown due to over temperature, such schemes may also force interruption of any activity (e.g., transmission of an RF signal) related to operation of the amplifier module. It follows that there may be a need for improved over temperature protection of an RF amplifier module, such as the RF power amplifier module (110) shown in the prior art configuration of FIG. 1, that not only protects the amplifier from thermal breakdown due to over temperature, but also maintains an ongoing activity of the amplifier (e.g., soft shutdown). Teachings according to the present disclosure provide such improved over temperature protection.

SUMMARY

According to a first aspect of the present disclosure, a circuit is presented, the circuit comprising: a bias circuit configured to supply a bias signal based on a control current; and a protection circuit configured to detect a temperature and generate therefrom the control current, wherein for a detected temperature that is: i) lower than a preset high temperature limit, the control current is constant, and ii) higher than the preset high temperature limit, the control current is a linear function of the detected temperature having a negative slope with respect to increasing values of the detected temperature.

According to a second aspect of the present disclosure, a method for controlling a current through an amplifier is presented, the method comprising: controlling a current to the amplifier based on a detected value of a temperature of the amplifier, such that for detected values of the temperature above a preset temperature limit, the current to the amplifier decreases linearly with respect to increasing detected values of the temperature, and based on the controlling, reducing a power dissipated through the amplifier for the detected values of the temperature above the preset temperature limit.

Further aspects of the disclosure are provided in the description, drawings and claims of the present application.

BRIEF DESCRIPTION OF DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 3B shows a graph representative of a temperature of the PA module of FIG. 3A for a given output power of the PA based on varying levels of external parameters to the PA module.

Like reference numbers and designations in the various drawings indicate like elements.

DETAILED DESCRIPTION

Throughout the present disclosure, embodiments and variations are described for the purpose of illustrating uses and implementations of inventive concepts of various embodiments. The illustrative description should be understood as presenting examples of the inventive concept, rather than as limiting the scope of the concept as disclosed herein.

Figure 1:
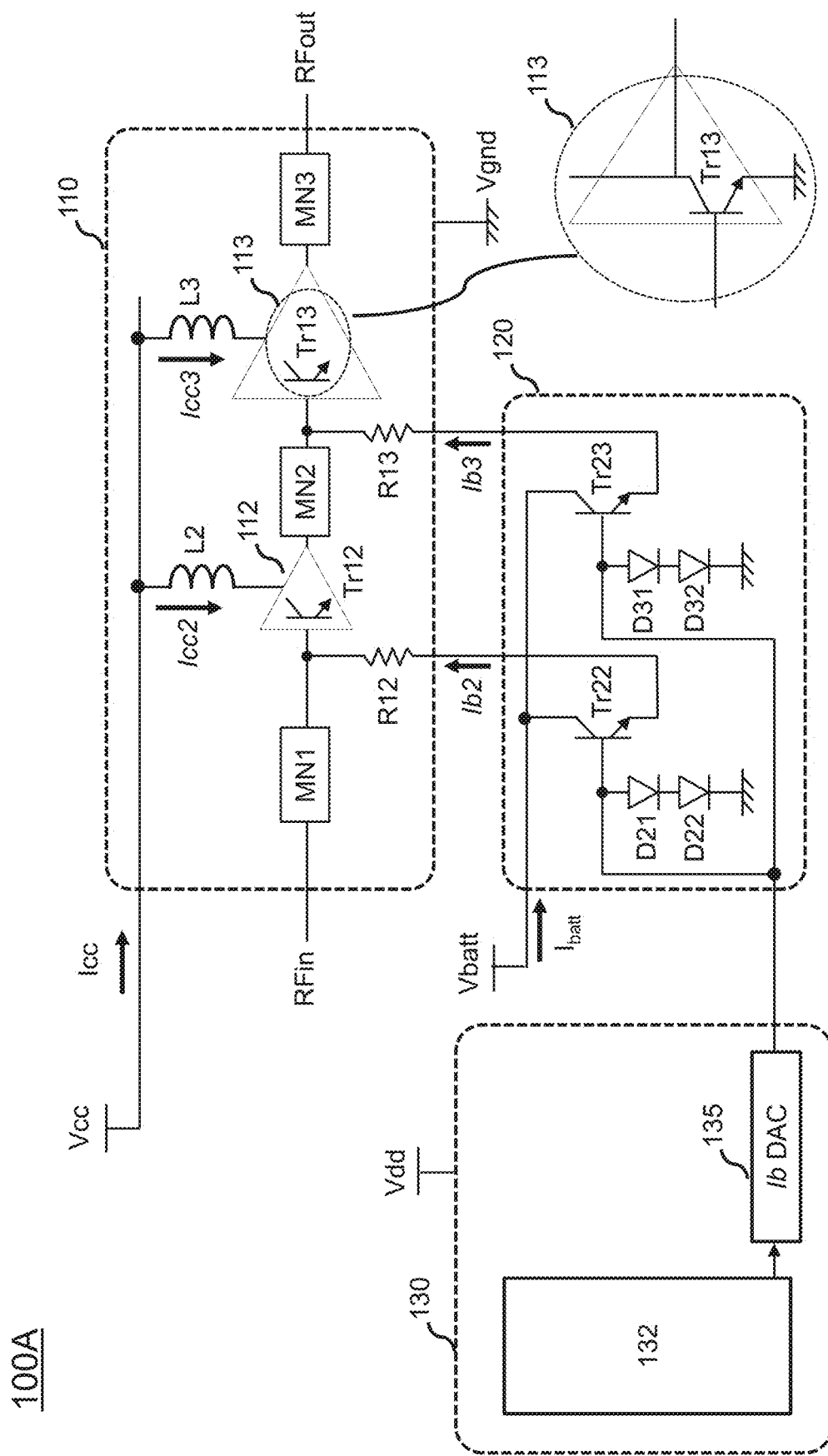
FIG. 1 shows a prior art RF power amplifier (PA) module and a biasing circuit to provide biasing signals to the PA module.
Figure 2:
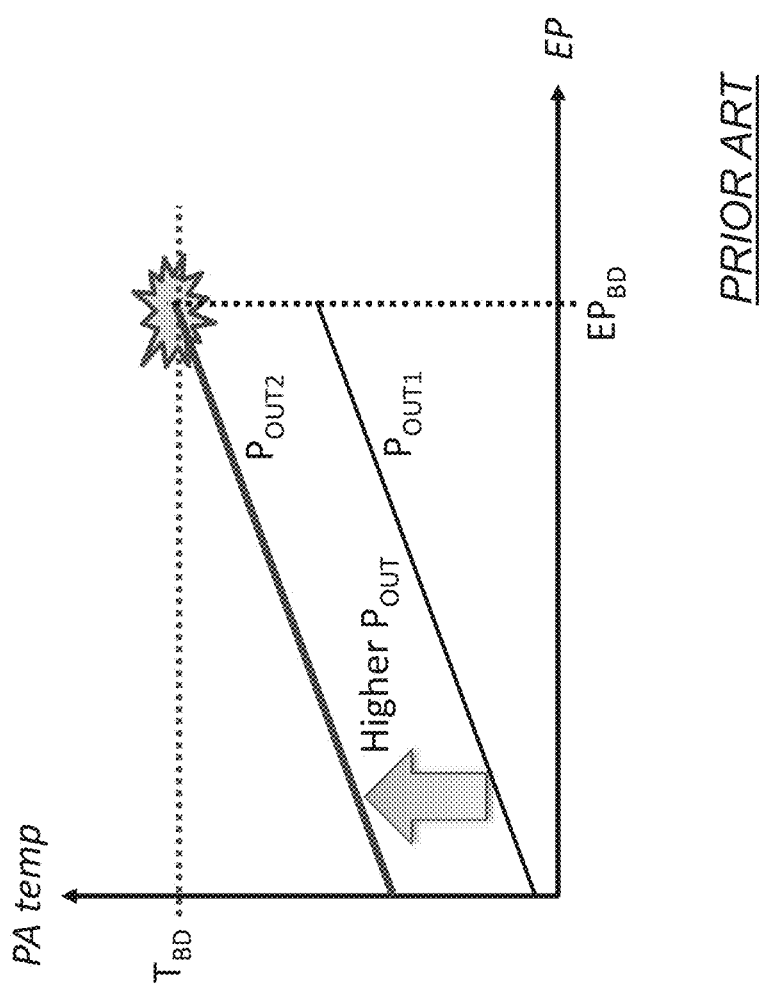
FIG. 2 shows graphs representative of a temperature variation of the PA module of FIG. 1 for a given output power of the PA module based on varying levels of external parameters to the PA module.
Figure 3A:
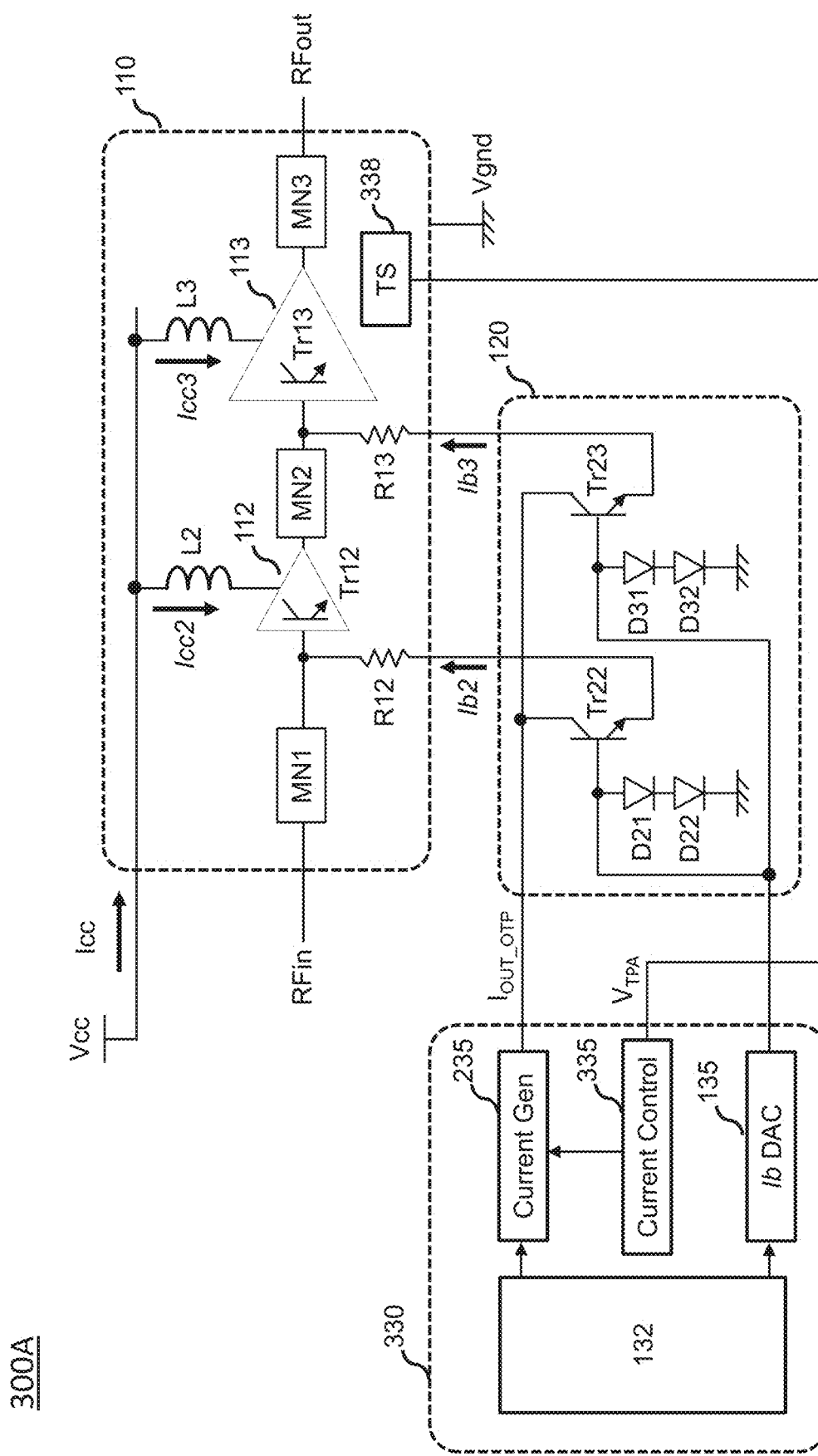
FIG. 3A shows a configuration according to an embodiment of the present disclosure of a RF power amplifier (PA) module and a biasing circuit to provide biasing signals to the PA module, wherein the biasing circuit decreases a current through the PA module for increasing values of a temperature of the PA module.

FIG. 3A shows a configuration (300A) according to an embodiment of the present disclosure comprising an RF power amplifier (PA) module (110) and a biasing circuit (120) to provide biasing signals to the PA module (110), wherein under control of a controller circuit (330), the biasing circuit (120) may be configured to decrease collector currents (e.g., Icc2 and/or Icc3) through the PA module (110) for increasing values of a (sensed) temperature of the PA module (110) beyond a high temperature limit, thereby preventing over temperature breakdown of the PA module (110) without shutting down (operation of) the PA module (110). In other words, current (values) through the collectors of one or more of the common-emitter transistors (Tr12, Tr13) of the PA module (110) may be: unchanged (e.g., constant) for values of the temperature of the PA module (110) that are lower than a high temperature limit; and decreased for values of the temperature of the PA module (110) that are higher than the high temperature limit. Such decrease in the collector current (e.g., Icc2 and/or Icc3) may correspondingly reduce power dissipation, and therefore temperature, of the PA module (110) while allowing the PA module (110) to continue operation. As a result of the reduction in power dissipation of the PA module (110), and as shown in FIG. 3B, effect of external parameters (EP) on the temperature of the PA module (110) as described above with reference to FIGS. 1-2, may be mitigated. It should be noted that although the biasing circuit (120) may be described as a separate circuit from the PA module (110), mainly based on its separate functionality compared to the PA module (110), in some embodiments, the PA module (110) may be described as further comprising the biasing circuit (120), or even the controller circuit (330). Accordingly, such combination of circuits may be monolithically integrated as a single chip.

FIG. 3B shows a graph representative of a temperature of the PA module (110) of FIG. 3A (for a given output power) based on varying levels of external parameters, EP, to the PA module (110). As shown in FIG. 3B, for varying levels of the external parameters, EP, the temperature, PA temp, of the PA module (110) may increase at a higher rate (greater slope) when the PA temp is below a high temperature limit, $T_L$, and at a lower rate (smaller slope) when the PA temp is above the high temperature limit, $T_L$. The lower rate of increase in the PA temperature, PA temp, may be attributed to the above-described decrease in the collector current (e.g., Icc2 and/or Icc3), which may be, for example, a linear decrease with respect to increasing values of the PA temperature above the high temperature limit. It should be noted that although the graph of FIG. 3B shows a knee of a represented curve (PA temp versus EP) at a coordinate ($EP_{BD}$, $T_L$), teachings according to the present disclosure may not require a priori knowledge of a value of $EP_{BD}$, or a specific external parameter represented by $EP_{BD}$. Rather, teachings accordingly to the present disclosure may measure a global effect of the external parameters as observed by the sensed PA temperature (PA temp), and control biasing of the PA module (110) accordingly. In other words, a sufficient input for the over temperature protection scheme according to the present disclosure may be a sensed temperature. Although the sensed temperature may be a local temperature of the PA module (110), in some embodiments according to the present disclosure other temperatures may be used, such as, for example, an ambient temperature (e.g., room temperature) of a device (e.g., cellular phone) that includes the PA module (110). For example, ambient temperature may be used in cases where effects of the external parameters may mainly be attributed to the ambient temperature.

Teachings according to the present disclosure may control biasing signals to the PA module (110) to counter/reduce/mitigate effects of the external parameters, EP, on increasing the temperature of the PA module (110) while allowing operation of the PA module (110) to continue. As described above, such control of the biasing signals may be, for example, a linear decrease of the collector currents (e.g., Icc2 and/or Icc3 of FIG. 3A) for sensed PA temperatures above the high temperature limit, $T_L$, to obtain the graph shown in FIG. 3B, the linear decrease based on a decreasing linear function of a (collector) current for increasing values of the sensed PA temperature above the high temperature limit, $T_L$ (e.g., bottom graph of FIG. 4B later described). According to another exemplary embodiment of the present disclosure, the decreasing linear function can be segmented based on values of the sensed PA temperature, with linear segments having different slopes (e.g., negative slopes) with respect to the increasing values of the sensed PA temperature.

With reference back to FIG. 3A, accordingly, to an embodiment of the present disclosure, the temperature of the PA module (110) may be sensed by a temperature sensor, TS (338), that may be placed at a vicinity of the PA module (110). According to an exemplary embodiment of the present disclosure, the temperature sensor (338) may be placed closer to a higher output power (e.g., hotter, higher temperature) stage of the PA module (110), such as, for example, closer to the output driver stage (113) shown in FIG. 3A. According to a nonlimiting embodiment of the present disclosure, the temperature sensor (338) may be embedded/fabricated within a same die used for fabrication of the PA module (110) or a stage thereof (e.g., 113). Such close proximity of the temperature sensor (338) to the PA module (110) may allow sensing of a local temperature of the PA module (110) that may therefore represent the temperature of the PA module (110). According to an exemplary embodiment of the present disclosure, the temperature sensor (338) may be a diode to which a biasing current may be provided (e.g., as shown in FIG. 5C later described). The temperature sensor (338) according to the present teachings may be any temperature sensor known in the art, including, for example, a thermocouple, a resistor, or other, that may be suited for integration with the PA module (110) or otherwise sense a local or ambient temperature. Furthermore, as later described in the present disclosure, a characteristic response curve of such temperature sensor may be provided by a decreasing output voltage with respect to an increasing sensed temperature, or an increasing output voltage with respect to an increasing sensed temperature. Implementations of the over temperature protection scheme according to the present disclosure for each of such characteristic responses of a temperature sensor are later described in the present disclosure (e.g., with reference to FIG. 4A and FIG. 6A).

Figure 7:
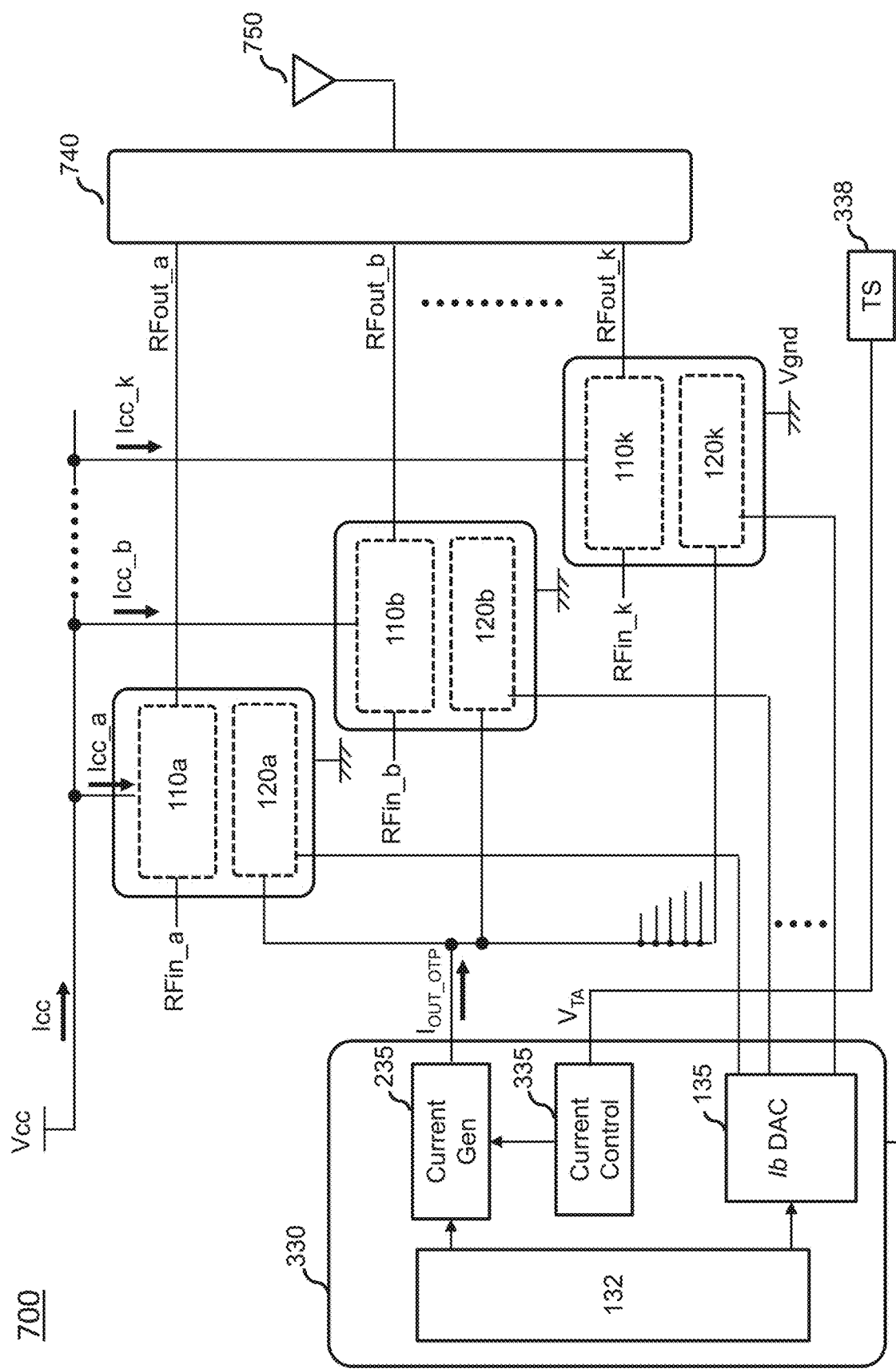
FIG. 7 shows a simplified block diagram of a transmitter section of an RF front-end communication system using a plurality of PA modules each according to the configuration shown in FIG. 3A and sharing a single over temperature voltage protection circuit according to the configuration of FIG. 4A or FIG. 6A

With further reference to FIG. 3A, according to an embodiment of the present disclosure, the voltage, $V_{TP4}$, output by the temperature sensor, TS (338), may be provided as input to the controller circuit (330), and based on the voltage, $V_{TP4}$, the controller circuit (330) may generate a current, $I_{OUT\_OTP}$, that may be supplied to the collector of the emitter-follower transistors (Tr22, Tr23) of the biasing circuit (120). The current $I_{OUT\_OTP}$ may define (high) values of the biasing currents (Ib2, Ib3) to the common-emitter transistors (Tr12, Tr13), which in turn define (high) values of the collector currents (Ic2, Ic3). As can be seen in FIG. 3A, the voltage, $V_{TP4}$, output by the temperature sensor (338) may be provided as input to a current control circuit (335) that controls a current generator circuit (235) to output the current, $I_{OUT\_OTP}$. As shown in FIG. 4C later described, the current, $I_{OUT\_OTP}$, may be constant for a lower range of temperatures of the PA, and include a (negative) slope for a higher range of temperatures of the PA. According to a further embodiment of the present disclosure, the current control circuit (335) may further control/generate the (negative) slope of the current, $I_{OUT\_OTP}$. In other words, such slope can be programmable. According to another embodiment of the present disclosure, the current control circuit (335) may determine a value of the voltage, $V_{TP4}$, at which the slope starts. In other words, the knee of slope (e.g., as shown in FIG. 3B) can be programmable. Programmability of the value and start location of the slope via the combination of a temperature sensor (e.g., TS, 338 of FIG. 3A), and the current control circuit (335), may allow the current generator circuit (235) to be used to control biasing currents to a plurality of different PA modules part of, for example, a same transmitter section of an RF front-end communication system as shown in FIG. 7 later described.

Figure 4A:
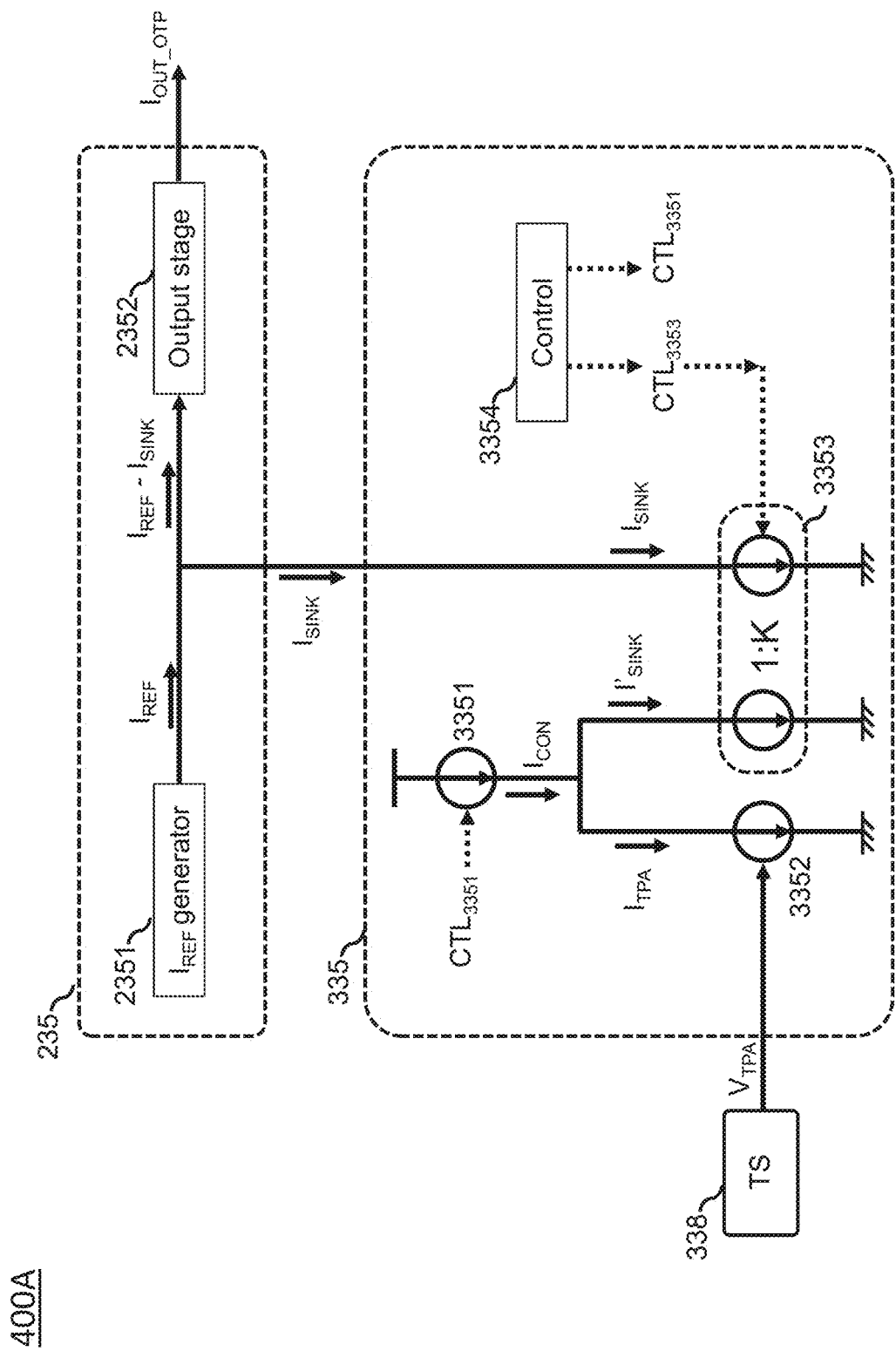
FIG. 4A shows a simplified schematic of an over temperature protection circuit according to an embodiment of the present disclosure.

FIG. 4A shows a simplified schematic (400A) of elements (235, 335, 338 which may be referred to as a temperature protection circuit) of the controller circuit (330) shown in FIG. 3A that may be used to provide over temperature protection according to an embodiment of the present disclosure. As shown in FIG. 4A, the temperature sensor circuit (338) may sense/detect a temperature (e.g., local or ambient) and generates therefrom, a corresponding control signal, $V_{TP4}$, to control a magnitude of a current, $I_{TP4}$, output by a current source (3352) of the current control circuit (335). According to an embodiment of the present disclosure, the magnitude of the current, $I_{TP4}$ is proportional to a level of the control signal, $V_{TP4}$, and therefore of the temperature sensed by the temperature sensor circuit (338). In other words, within a voltage range of interest, $I_{TP4}=k*V_{TP4}$. The factor k may be programmable and provided, for example, by changing a number of parallel current sources (current mirrors) of the current source (3352) via designs and methods well known to a person skilled in the art, details of which are beyond the scope of the present disclosure. It should be noted that the configuration shown in FIG. 4A is tailored to a temperature sensor circuit (338) with a nonlimiting characteristic response curve according to the above-described FIG. 3B and therefore one with a decreasing sensed/output voltage for an increasing temperature.

With continued reference to FIG. 4A, a current source (3351) that generates a constant current, ICON, is in series connection with two separate current paths, one path including the current source (3352) and another path including a reference leg of a current mirror (3353). As clearly understood to a person skilled in the art, so long as the current $I_{TP4}$ is greater than the current $I_{CON}$ generated by the current source (3351), an entirety of the current $I_{CON}$ flows through the current source (3352) and therefore no current flows through the reference leg of the current mirror (3353). In other words, the current $I'_{SINK}$ through the reference leg and the corresponding current $I_{SINK}$ through the target leg of the current mirror (3353) are null. On the other hand, when the current $I_{TP4}$ is smaller than the current $I_{CON}$ that is generated by the current source (3351), a surplus (difference) current $I_{CON}-I_{TP4}$ above what the current source (3352) can sink flows through the reference leg of the current mirror (3353), and consequently a corresponding current $I_{SINK}=K*I'_{SINK}=K*(I_{CON}-I_{TP4})$ flows through the target leg of the current mirror (3353), wherein K is a number corresponding to a ratio of currents between the reference and target legs of the current mirror (3353).

According to the above description, the current Is INK through the target leg of the current mirror (3353) is: i) equal to zero for values of the voltage, $V_{TP4}$, output by the temperature sensor (338) for which $I_{TP4} \geq I_{CON}$, and ii) equal to $K*(I_{CON}-I_{TP4})$ for values of the voltage, $V_{TP4}$, output by the temperature sensor (338) for which $I_{TP4}<I_{CON}$. As the current $I_{TP4}$ is proportional to the value of the voltage, $V_{TP4}$, it follows that when the current $I_{SINK}$ is non-zero, it increases proportionally with a decreasing value of the voltage, $V_{TP4}$. In other words, when the current $I_{SINK}$ is non-zero, it increases proportionally with an increasing value of the temperature sensed by the temperature sensor (338). Furthermore, a rate of increase, or slope, of the current $I_{SINK}$ with respect to decreasing value of the voltage, $V_{TP4}$, is based on the number K. In other words, by programmatically changing the value of K, the slope of the current $I_{SINK}$ (when not zero) can be changed. A person skilled in the art is well aware of design techniques for providing a parametric (programmable) ratio K of a current mirror (e.g., 3353). Finally, by programmatically changing a magnitude of the current $I_{CON}$ generated by the current mirror (3351), start of flow of current $I'_{SINK}$ through the reference leg, therefore flow of current $I_{SINK}$ through the target leg, of the current mirror (3353), can be changed as a linear function of a value of the voltage, $V_{TP4}$, or in other words, of a temperature. For example, for a higher value of the current $I_{CON}$, a proportionally higher value of the voltage, $V_{TP4}$, and therefore a proportionally lower value of the temperature sensed by the temperature sensor (338), may be required to start flow of current through the current mirror (3353).

Figure 4B:
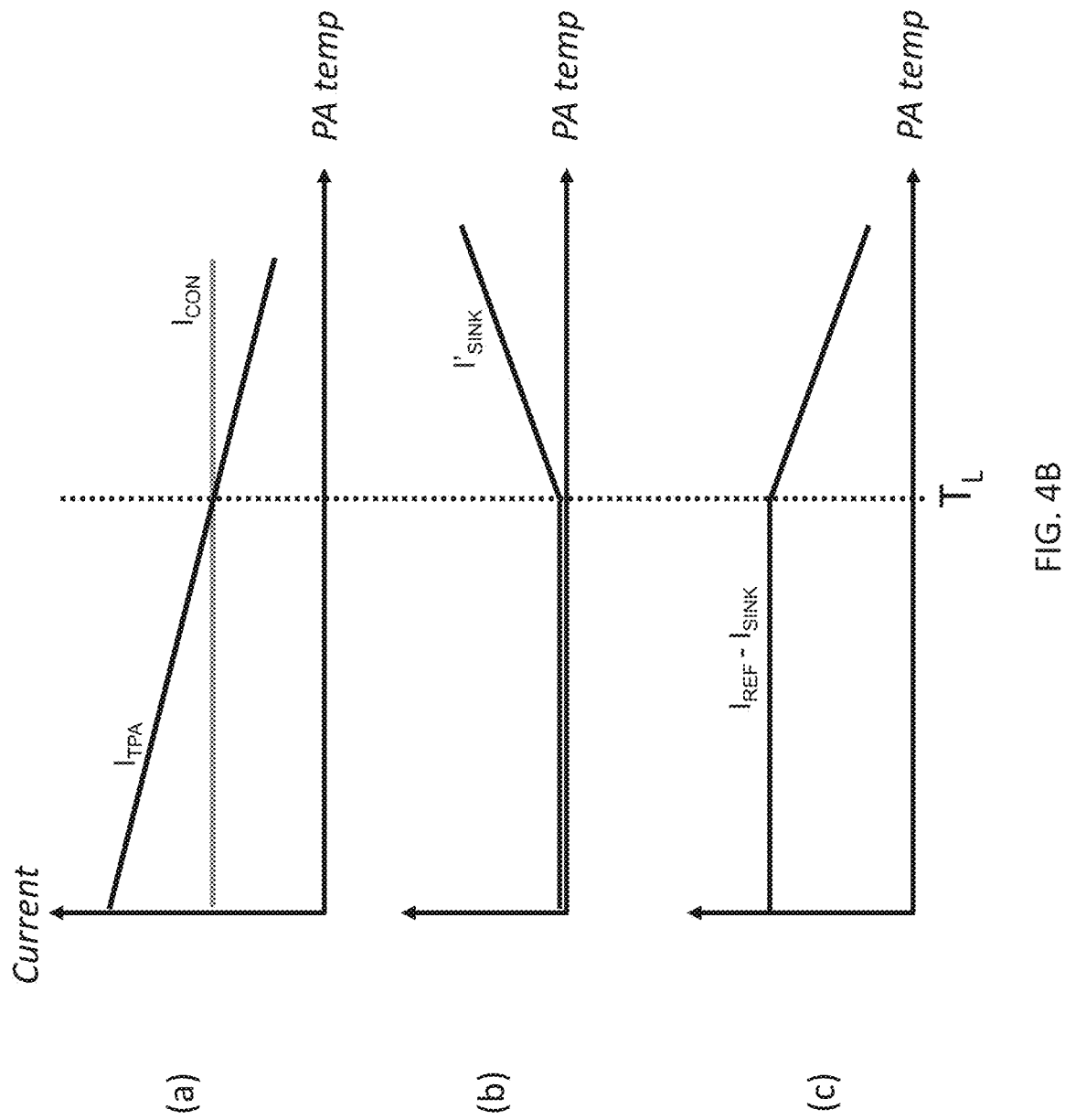
FIG. 4B and FIG. 4C show graphs representative of currents manipulations performed by the over temperature protection circuit of FIG. 4A as a function of a varying temperature of the PA module of FIG. 3A.
Figure 4C:
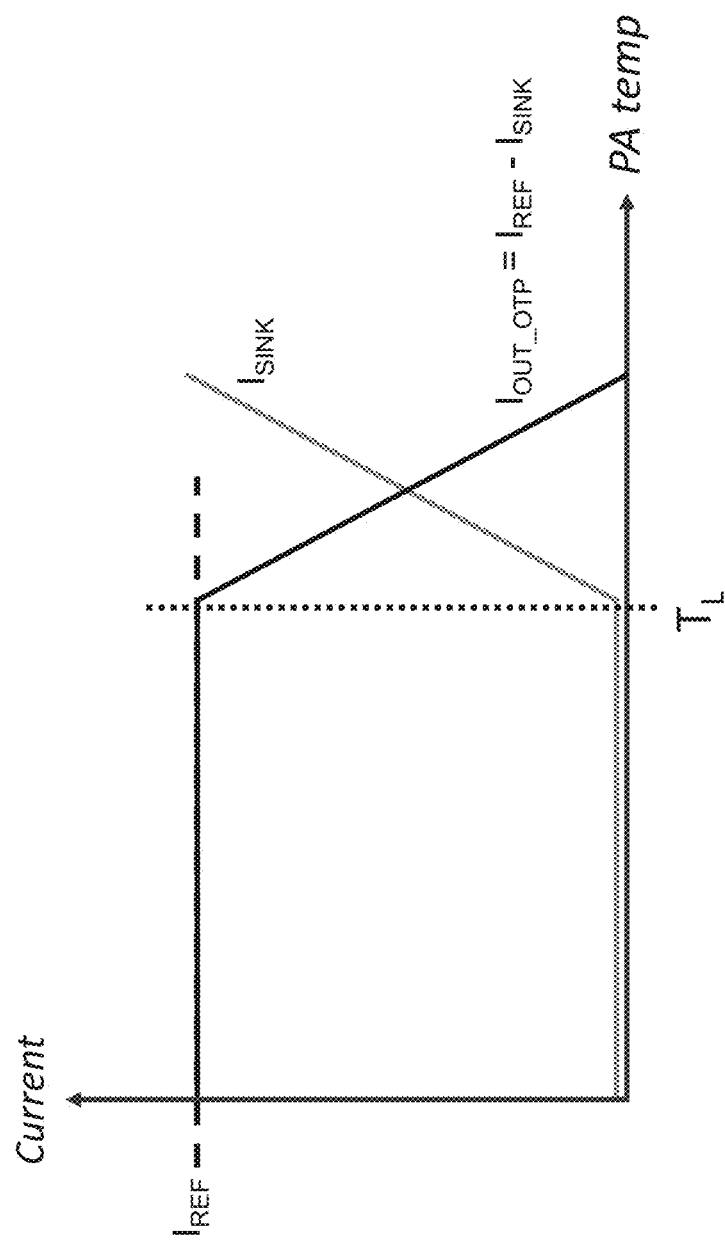

Accordingly, programmability of the current source (3351) and of the ratio K of the current mirror (3353) can respectively provide position and magnitude of a slope of the current $I_{SINK}$ (as shown in FIG. 4B later described). According to an exemplary embodiment of the present disclosure, as shown in FIG. 4A, programming of the current source (3351) and of the current mirror (3353) can be provided via a control circuit (3354) that generates respective control signals ($CTL_{3351}$, $CTL_{3353}$). According to alternative embodiment, the control circuit (3354) may be external to the current control circuit (335), such as, for example, part of a signal aware controller such as a transceiver system. It should be noted that control of various controllable and/or programmable elements/circuits according to the present teachings may require control lines and signals that may not be shown in the present figures, but certainly well understood by a person skilled in the art.

With continued reference to FIG. 4A, the current generator circuit (235) may include a reference current generation circuit (2351) that generates a reference current, $I_{REF}$, from which the current $I_{SINK}$ (generated by the current control circuit (335) is subtracted, to generate, as shown in FIG. 4A, a current ($I_{REF}-I_{SINK}$) that is fed to an output stage (2352) that may multiply such current to generate a larger current, $T_{OUT\_OTP}$, provided to the biasing circuit (120) shown in FIG. 3A. Accordingly, for values of the voltage, $V_{TP4}$, such that $I_{SINK}$ is equal to zero, the current, $I_{OUT\_OTP}$, may be a fixed/constant current determined by the reference current, $I_{REF}$, and for values of the voltage, $V_{TP4}$, such that $I_{SINK}$ is not equal to zero, the current, $I_{OUT\_OTP}$, may be a varying current that is determined by the reference current, $I_{REF}$, minus the current $I_{SINK}$, that as described above, is a linear function of the voltage, $V_{TP4}$. It should be noted that the reference current generation circuit (2351) may be programmable to output different magnitudes of the reference current, $I_{REF}$, and may be independent to temperature variation (at least within a temperature range of interest) via embedded temperature compensation circuits/elements that are well known in the art.

FIG. 4B and FIG. 4C show graphs corresponding to generation/manipulation of the various currents described above with reference to FIG. 4A. In particular, the graph (a) of FIG. 4B shows an intersection of the constant current, $I_{CON}$, with the (temperature) current, $I_{TP4}$, at a temperature limit point, $T_L$. As described above, a programmable value of the constant current, $I_{CON}$, in combination with a known characteristic response curve of the temperature sensor (338), may allow mapping of the intersection to a desired temperature limit point, $T_L$. Based on such intersection, as shown in graph (b) of FIG. 4B, flow of the current $I'_{SINK}$ through the reference leg of the current mirror (e.g., 3353 of FIG. 3A) can be established, which in turn, as shown in graph (c) of FIG. 4B, the current difference $I_{REF}-I_{SINK}$ that may be used to establish the current $I_{OUT\_OTP}$, can be established. Establishing of the current $I_{OUT\_OTP}$ based on the current difference $I_{REF}-I_{SINK}$ is shown in the graphs of FIG. 4C, including establishing of a) the reference current, $I_{REF}$, and of b) the current $I_{SINK}$ having zero value for values of the temperature below the temperature limit point, $T_L$, and positive non-zero values with a positive slope for values of the temperature above the temperature limit point, $T_L$.

Figure 5A:
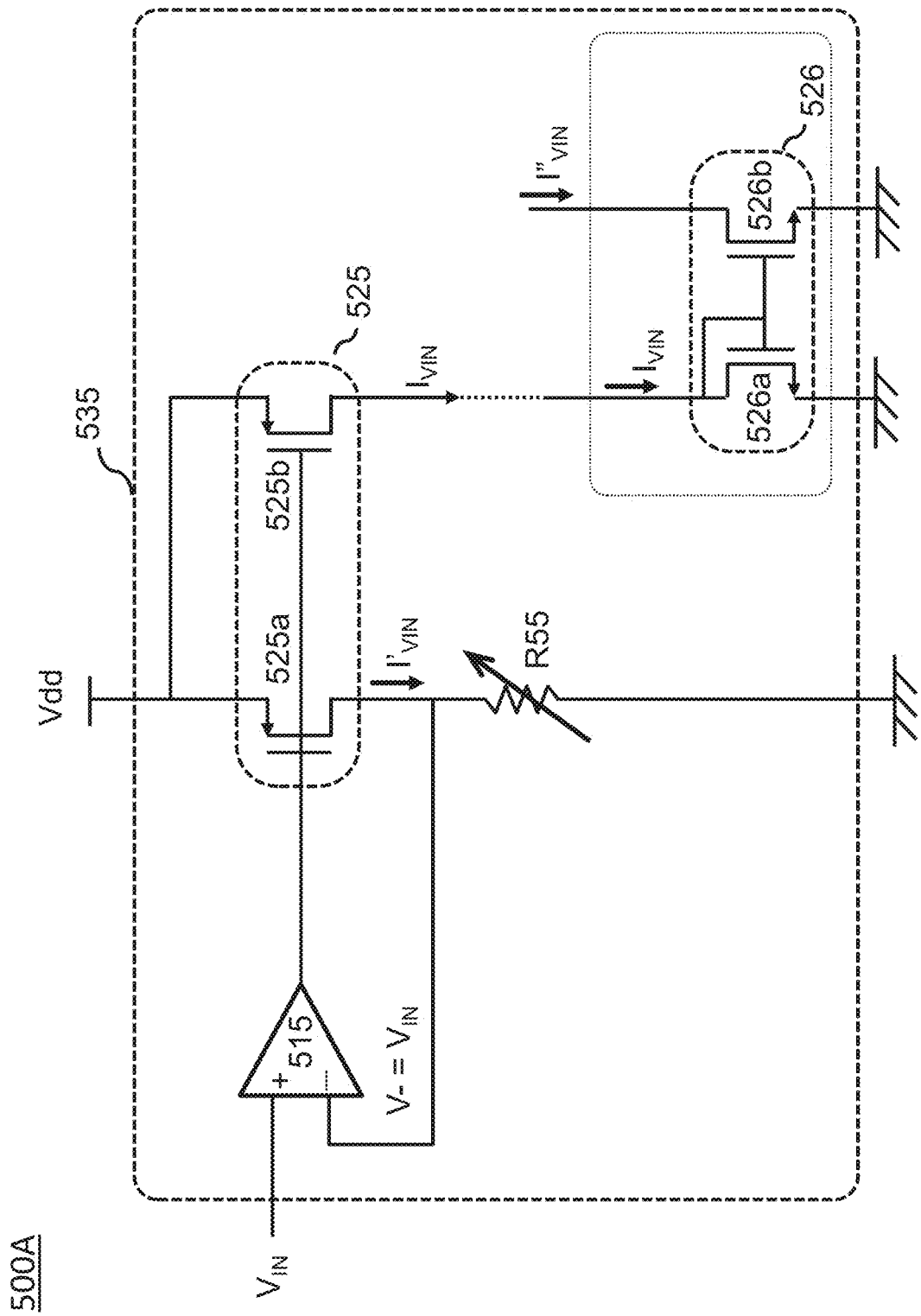
FIG. 5A shows a simplified schematic of a voltage to current convertor circuit that may be used in the over temperature protection circuit shown in FIG. 4A.

FIG. 5A shows a simplified schematic according to an exemplary embodiment of the present disclosure of a voltage to current convertor circuit (500A) that may be used to implement the over temperature protection described above with reference to FIG. 4A. As shown in FIG. 5A, an operational amplifier (515) connected in a non-inverting configuration receives, at its non-inverting input terminal (annotated by sign+in the figure), an input voltage, $V_{IN}$. Accordingly, the voltage at the inverting input terminal (annotated by sign—in the figure) of the operational amplifier (515), takes the voltage, $V_{IN}$, which is then provided to a shunted resistor R55 coupled between the inverting input terminal of the operational amplifier (515) and the reference ground, Vgnd. As shown in FIG. 5A, a PMOS current mirror (525), including a first PMOS transistor (525a) part of a reference leg of the PMOS current mirror (525) and a second PMOS transistor (525b) part of a target leg of the PMOS current mirror (525) is coupled to the operational amplifier (515) such that gates of the first and second PMOS transistors (525a, 525b) are connected/coupled to an output terminal of the operational amplifier (515) and a drain of the first PMOS transistor (525a) is coupled to a common node that couples the inverting input terminal of the operational amplifier (515) and the shunted resistor R55. Furthermore, the sources of the first and second PMOS transistors (525a, 525b) are coupled to a (substantially) fixed supply voltage Vdd. Such fixed supply voltage Vdd may be a regulated voltage based on, for example, a battery. In some nonlimiting exemplary embodiments, the fixed supply voltage, Vdd, may be at about 3 volts, whereas the supply voltage Vcc (e.g., shown in other figures) may vary from about 3 volts up to about 6.5 volts or more.

With continued reference to FIG. 5A, because the voltage at the drain of the first transistor (525a) is equal to the input voltage, $V_{IN}$, a current $I'_{VIN}$ through the shunted resistor R55, and therefore through the reference leg (i.e., through 525a) of the PMOS current mirror (525), is equal to $V_{IN}/R55$, and is therefore proportional to the input voltage, $V_{IN}$. Accordingly, the current $I_{VIN}$ that flows through the target leg (i.e., through 525b) of the PMOS current mirror (525), which is a scaled version of the current $I'_{VIN}$ that flows through the reference leg, is also proportional to the input voltage, $V_{IN}$. Accordingly, the circuit shown in FIG. 5A may be used to generate a source current, $I_{VIN}$ that is proportional to an input voltage, $V_{IN}$. Furthermore, an NMOS current mirror (526), including a first NMOS transistor (526a) part of a reference leg of the NMOS current mirror (526) and a second NMOS transistor (526b) part of a target leg of the NMOS current mirror (526) may be coupled to PMOS current mirror (525) as shown in FIG. 5A in order to generate a sink current, $I''_{VIN}$, that is also proportional to the input voltage, $V_{IN}$.

With continued reference to FIG. 5A, according to an exemplary embodiment of the present disclosure, the shunted resistor R55 may optionally have a programmable, variable, settable resistance that can be controlled/varied in steps and/or continuously. Such programmability of the resistor R55 can allow calibration of the voltage versus current response provided by the resistor R55 in the circuit shown in FIG. 5A. Such programmability may be used to overcome large resistance variations in a fabrication process (e.g., CMOS process) used to fabricate the circuit shown in FIG. 5A. Such calibration via tweaking of resistance value of the resistor R55 can be performed at any stage of integration of the circuit shown in FIG. 5A, including at a factory prior to shipment and/or at an assembly site where the circuit of FIG. 5A, which may be integrated, for example, with the circuit shown in FIG. 3A, is assembled as part of a transmitter device, such as, for example, a portable/handheld mobile device.

Figure 5B:
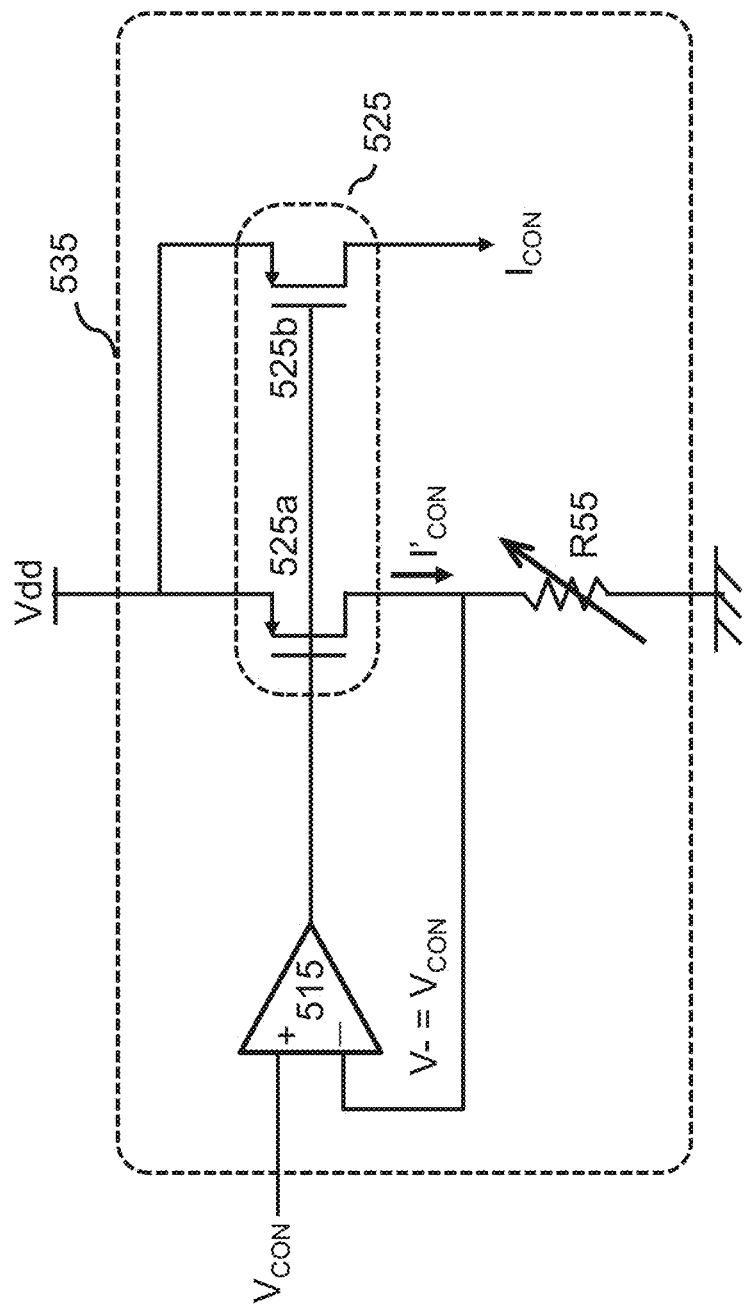
FIG. 5B shows a schematic of the voltage to current converter circuit of FIG. 5A used to generate a constant current for the over temperature protection circuit shown in FIG. 4A.
Figure 5C:
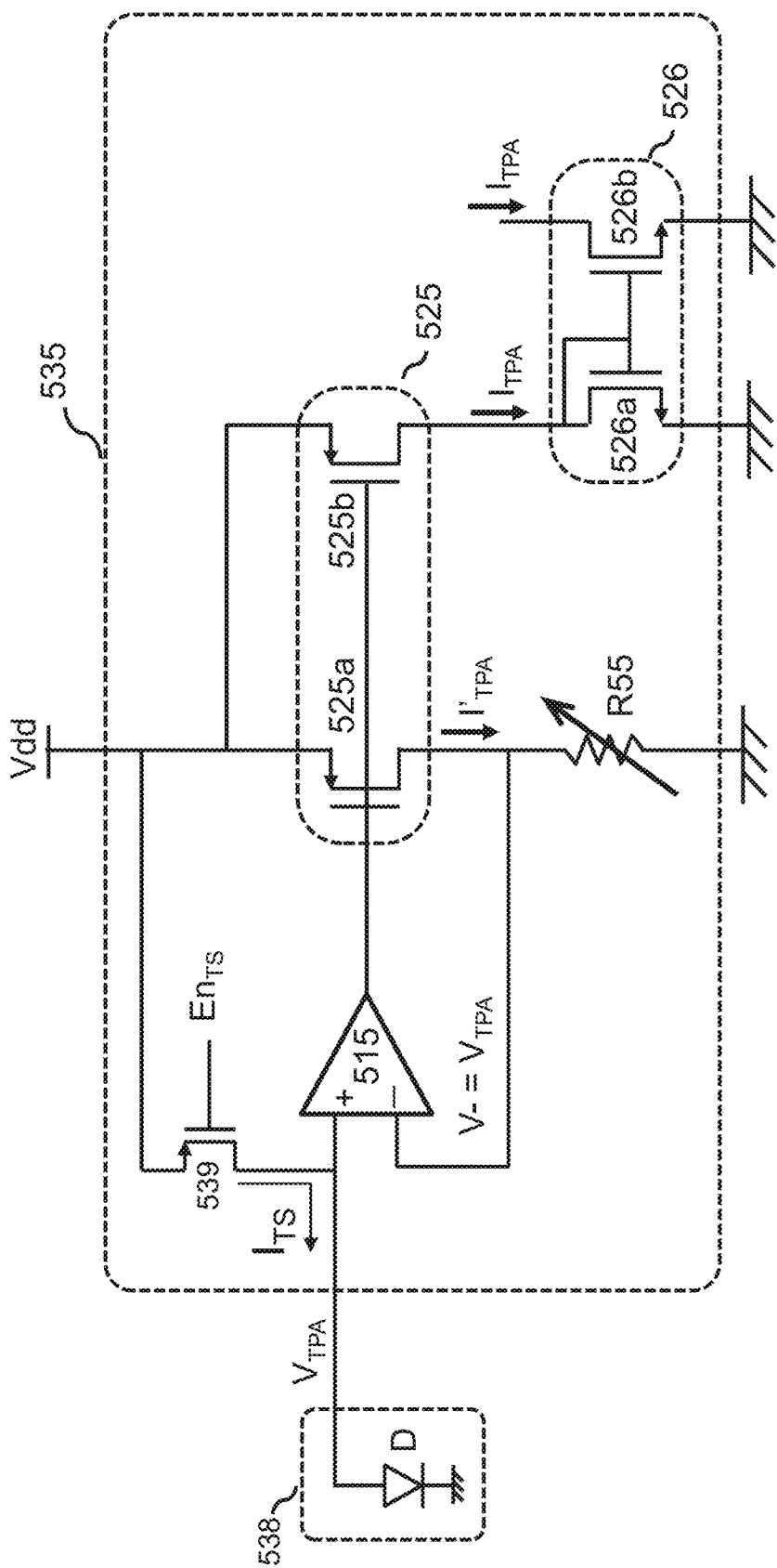
FIG. 5C shows a schematic of the voltage to current converter circuit of FIG. 5A used to generate a varying current based on a varying voltage sensed by a temperature sensor for the over temperature protection circuit shown in FIG. 4A.

The current convertor circuit (500A) of FIG. 5A may be used to generate, for example, the constant current, $I_{CON}$, and/or the current $I_{TP4}$, described above with reference to FIG. 4A. This is shown respectively in FIG. 5B and FIG. 5C. In the configuration (500B) of FIG. 5B, an input voltage to the current convertor circuit is a constant voltage, $V_{CON}$, based on which the current $I_{CON}$ is generated. Accordingly, different values of the constant voltage, $V_{CON}$, and/or different ratios of the transistors (525a, 525b) of the PMOS mirror (525) may provide different values of the current $I_{CON}$. On the other hand, in the configuration (500C) of FIG. 5C, an input voltage to the current convertor circuit is the voltage, $V_{TP4}$, output by a temperature sensor (e.g., 538), which generates the current $I_{TP4}$. Because in the configuration shown in FIG. 4A the current $I_{TP4}$ is a sinking current, then, as shown in FIG. 5C, the NMOS current mirror (526) may be used to generate a sinking current $I_{TP4}$ based on the source current output by the PMOS current mirror (525).

With continued reference to FIG. 5C, according to an exemplary embodiment of the present disclosure, the temperature sensor (538) may be a diode, D, that outputs the voltage, $V_{TP4}$, based on a (constant/fixed) biasing current, $I_{TS}$. According to an exemplary embodiment of the present disclosure, the biasing current, $I_{TS}$, may be provided through a (PMOS) transistor switch (539) whose ON/OFF state is controlled by a control signal, $En_{TS}$. According to an exemplary embodiment of the present disclosure, the control signal, $En_{TS}$, may be provided by the control circuit (3354) described above with reference to FIG. 4A. In some cases, the control signal, $En_{TS}$, may be provided by an output of the operational amplifier (515) of FIG. 5B used in generating of the constant current, $I_{CON}$. It should be noted that teachings according to the present disclosure may not be limited to a temperature sensor (e.g., 538) located at close proximity to the PA module (e.g., 100 of FIG. 3A) for measurement/sensing of a local temperature that is indicative of the temperature of the PA module (e.g., 100 of FIG. 3A). Accordingly, the temperature sensor (538) of FIG. 5A may be local to, or remote from, the PA module (e.g., 100 of FIG. 3A).

Figure 6A:
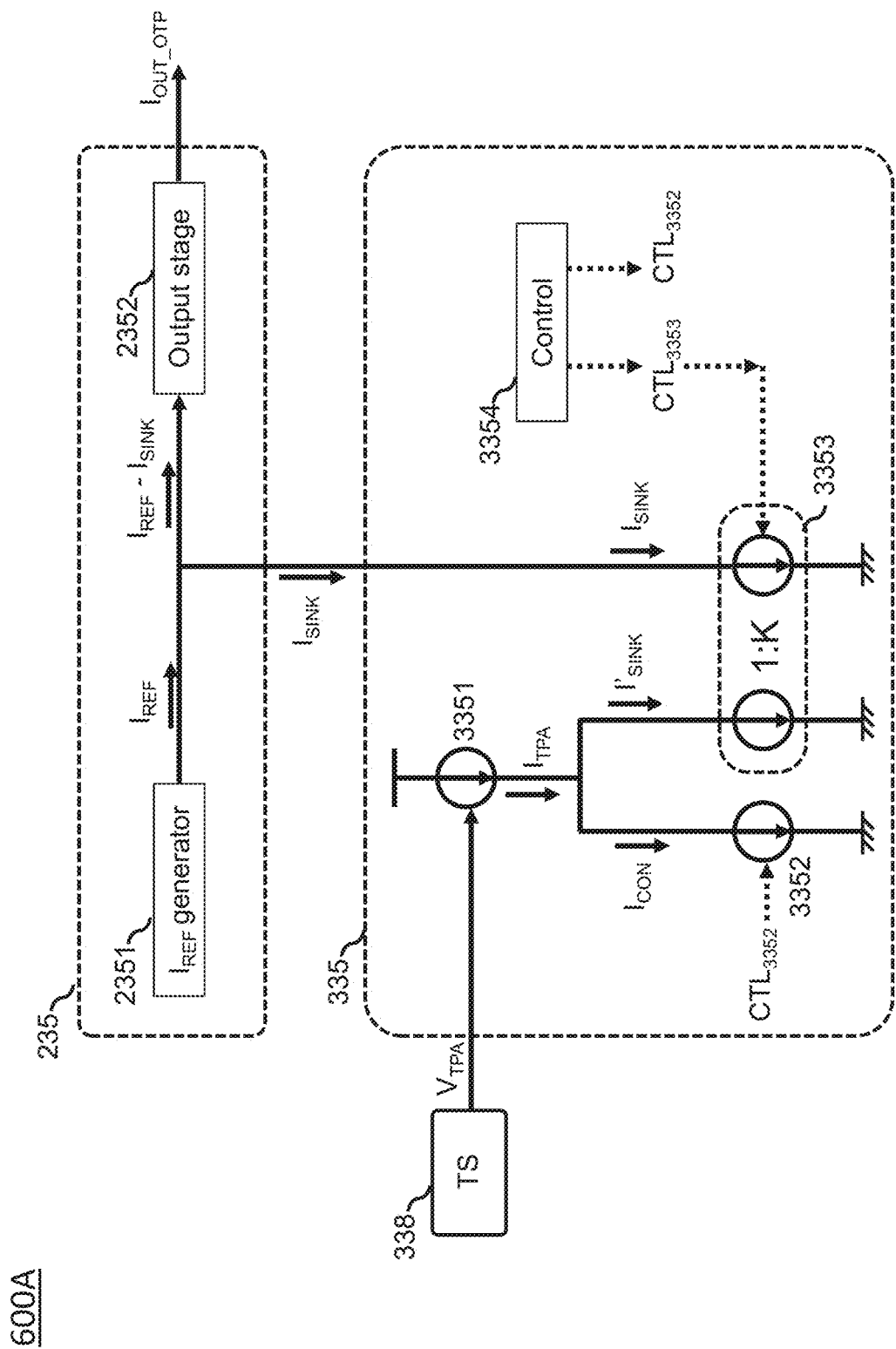
FIG. 6A shows a simplified schematic of another over temperature protection circuit according to an embodiment of the present disclosure.
Figure 6B:
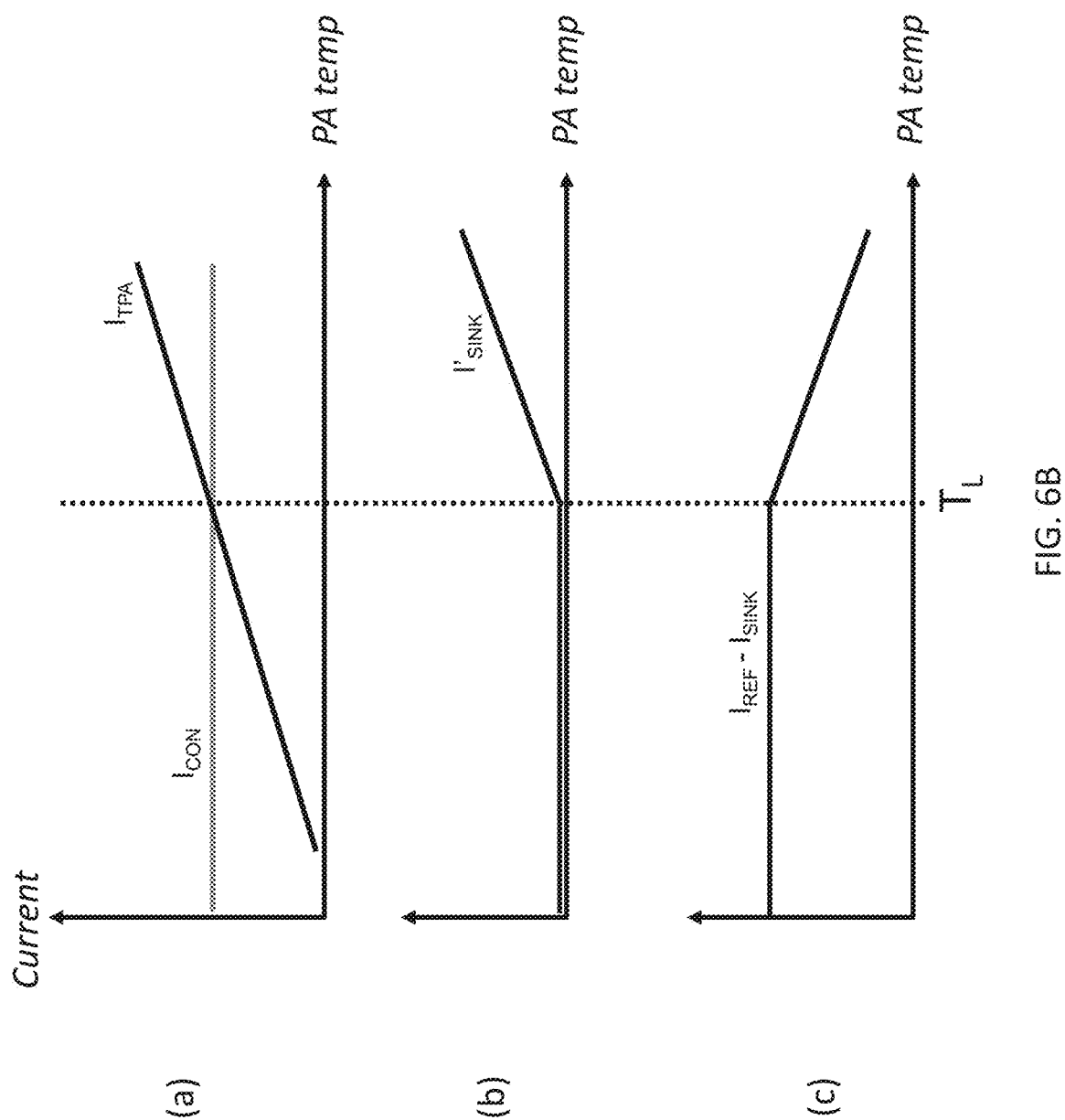
FIG. 6B and FIG. 6C show graphs representative of currents manipulations performed by the over temperature protection circuit of FIG. 6A as a function of a varying temperature of the PA module of FIG. 3A.
Figure 6C:
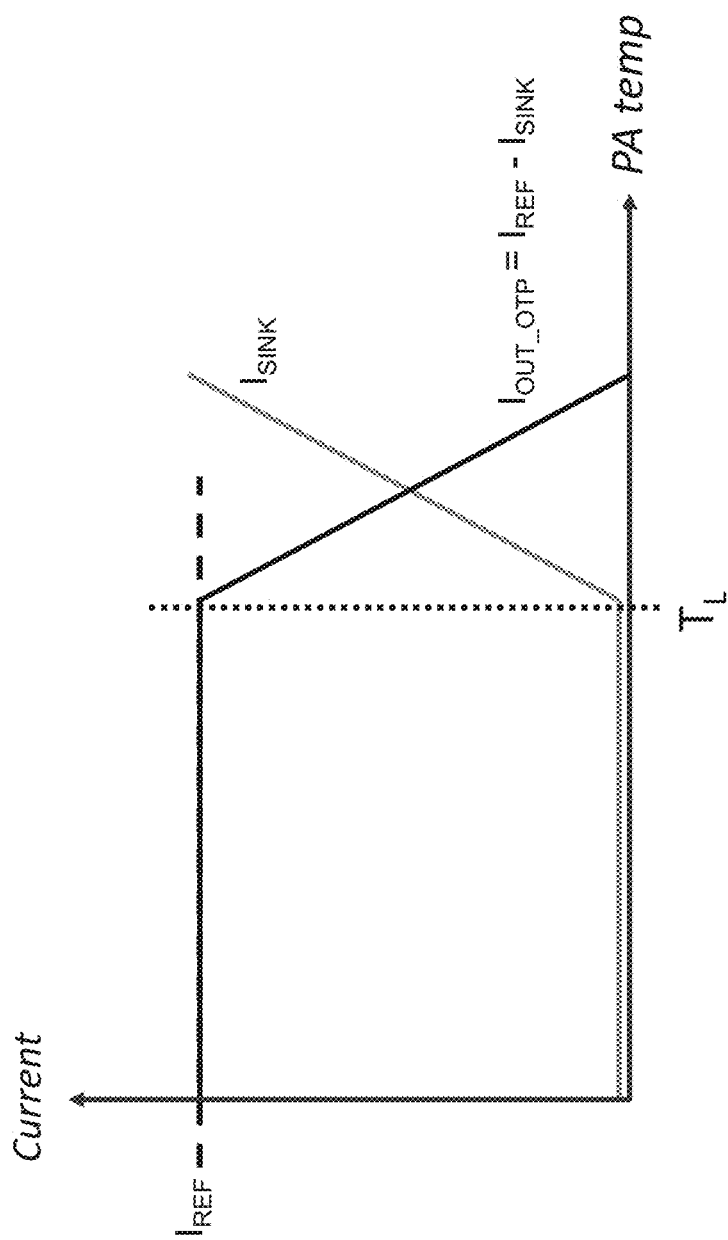

FIG. 6A shows a simplified schematic (600A) of elements (235, 335, 338 which may be referred to as a temperature protection circuit) of the controller circuit (330) shown in FIG. 3A that may be used to provide over temperature protection according to another embodiment of the present disclosure. The configuration shown in FIG. 6A may be used with a temperature sensor circuit (338) having a characteristic response curve different from the above-described curve shown in FIG. 3B. In particular, the configuration shown in FIG. 6A may be used with a temperature sensor (338) having a characteristic response curve with an increasing sensed/output voltage for an increasing temperature. In other words, the current control circuit (335) of FIG. 6A may be considered as the dual of the current control circuit (335) described above with reference to FIG. 4A. Accordingly, the current Is INK through the target leg of the current mirror (3353) of FIG. 6A is: i) equal to zero for values of the voltage, $V_{TP4}$, output by the temperature sensor (338) for which $I_{CON} \geq I_{TP4}$, and ii) equal to $K^*(I_{TP4}-I_{CON})$ for values of the voltage, $V_{TP4}$, output by the temperature sensor (338) for which $I_{CON} < I_{TP4}$. As the current $I_{TP4}$ is proportional to the value of the voltage, $V_{TP4}$, it follows that when the current $I_{SINK}$ is non-zero, it increases proportionally with an increasing value of the voltage, $V_{TP4}$. In other words, when the current $I_{SINK}$ is non-zero, it increases proportionally with an increasing value of the temperature sensed by the temperature sensor (338). Corresponding current graphs are shown in FIG. 6B and FIG. 6C with correspondence to related description provided above with reference to the graphs of FIG. 4B and FIG. 4C respectively.

FIG. 7 shows a simplified block diagram (700) of a transmitter section of an RF front-end communication system using a plurality of PA modules (110a, 110b, . . . , 110k) each according to the configuration shown in FIG. 3A coupled to respective biasing circuits (120a, 120b, . . . , 120k), and including (shared) elements (235, 335, 338) for provision of over temperature protection of each of the PA modules according to the above description with reference to FIG. 4A or FIG. 6A. As described above with reference to FIG. 4A and FIG. 6A, and in further view of the curves described above with reference to FIGS. 4B-4C and FIGS. 6B-6C, programmability, via the combination of the temperature sensor (338) and the current control circuit (335), of a value of the slope (rate of change with respect to change of $V_{TPA}$) and start location of the slope (i.e., based on a temperature limit point, $T_L$) of the current, $I_{OUT\_OTP}$, output by the current generator circuit (235) shown in FIG. 7, allows the current generator circuit (235) to be used to control biasing currents to a plurality of different PA modules (110a, 110b, . . . , 110k) part of, for example, a same transmitter section of an RF front-end communication system.

With continued reference to FIG. 7, at any given time, one of the plurality of PA modules (110a, 110b, . . . , 110k) may be coupled to an antenna (750) via an antenna switch (740) for transmission of an amplified RF signal (RFout_a, RFout_b, . . . , RFout_k). Accordingly, based on the description above with reference to, for example, FIG. 3A, in view of a selected PA module (e.g., 110b) coupled to the antenna (750), the DAC converter (135) may control the base voltage of the emitter-follower transistors (e.g., Tr22, Tr23) of a corresponding biasing circuit (120b) so that a desired biasing signal can be output at the emitter of each such emitter-follower transistor for biasing of the PA module (110b). Concurrently, slope and position of the slope of the current, $T_{OUT\_OTP}$ can be programmed based on, for example, thermal characteristics (e.g., including thermal breakdown temperature) of the selected PA module (110b). As shown in FIG. 7, the temperature sensor (338) may be arranged at any suitable location that for sensing a temperature of any one of the plurality of PA modules (110a, 110b, . . . , 110k). In some cases, the temperature sensor (338) may be located (e.g., distal the PA modules) such as to sense an ambient temperature within which the RF front-end communication system (represented in FIG. 7 by the block diagram 700) operates.

Figure 8A:
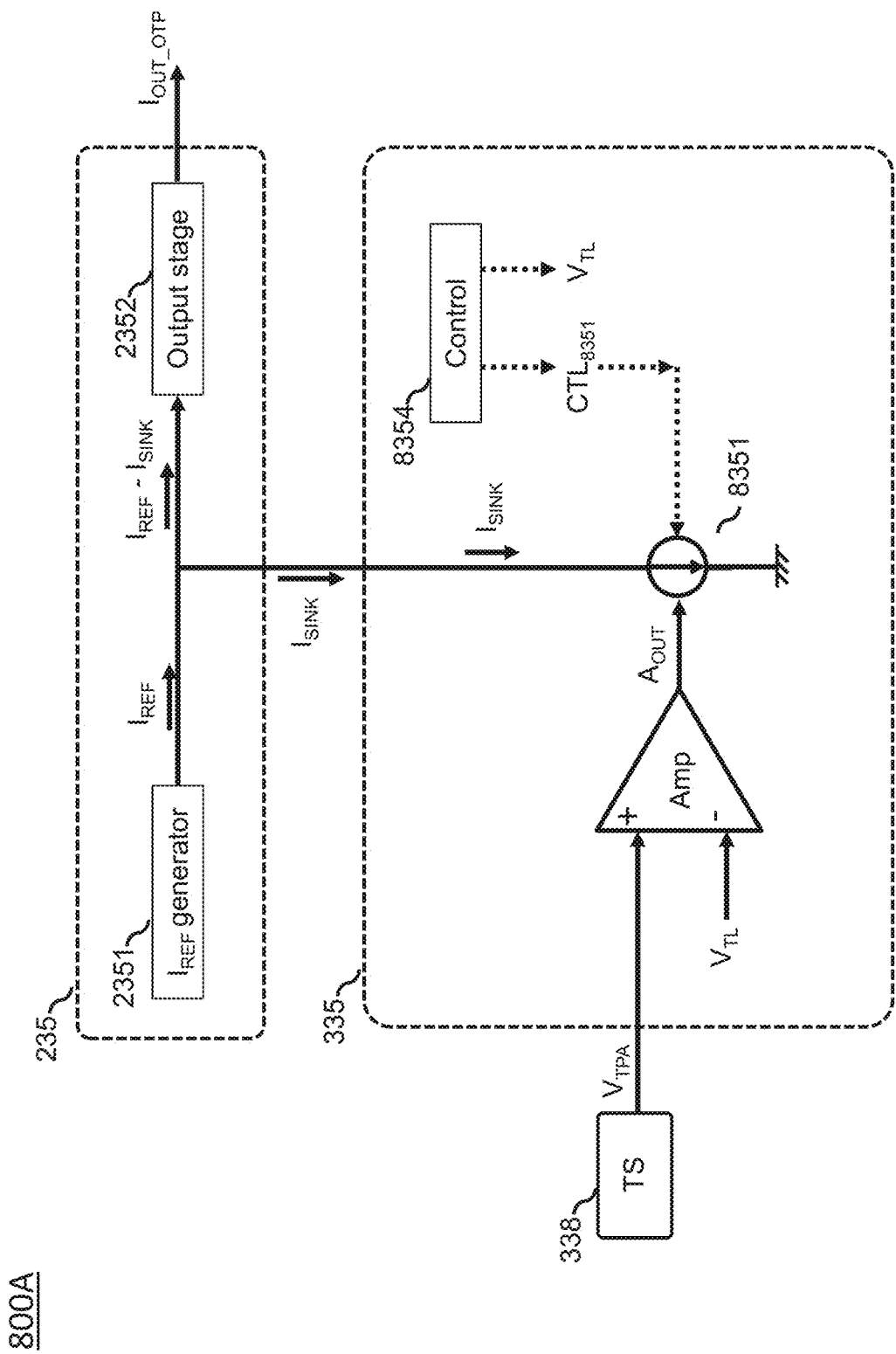
FIG. 8A shows a simplified schematic of another over temperature protection circuit according to an embodiment of the present disclosure.

FIG. 8A shows a simplified schematic (800A) of elements (235, 335, 338 which may be referred to as a temperature protection circuit) of the controller circuit (330) shown in FIG. 3A that may be used to provide over temperature protection according to yet another embodiment of the present disclosure. In particular, although elements (235, 338) shown in FIG. 8A may be same as elements (235, 338) described above with reference to FIG. 4A or FIG. 6A, the element (335) of FIG. 8A is different. As shown in FIG. 8A, the current $I_{SINK}$ may be generated by a current source (8351) under control of an (error) amplifier, Amp. According to an embodiment of the present disclosure, the amplifier, Amp, may output a control voltage, $A_{OUT}$, that may be a linear function of a difference between the voltage, $V_{TPA}$, provided to a non-inverting input terminal of the amplifier, Amp, and a reference limit voltage, $V_{TL}$, provided to an inverting input terminal of the amplifier, Amp. According to an embodiment of the present disclosure, the reference limit voltage, $V_{TL}$, may be programmable (e.g., via control circuit 8354, equivalent to control circuit of FIG. 4A or FIG. 6A) and correspond to a value of the voltage, $V_{TPA}$, output by the temperature sensor (338) at the (predetermined) high limit temperature, $T_L$. According to another embodiment of the present disclosure, for values of the voltage, $V_{TPA}$, such as $V_{TPA} - V_{TL} \geq 0$, the control voltage, $A_{OUT}$, may be equal to $V_{TPA} - V_{TL}$, and therefore an increasing linear function of the voltage, $V_{TPA}$. On the other hand, for values of the voltage, $V_{TPA}$, such as $V_{TPA} - V_{TL} < 0$, the control voltage, $A_{OUT}$, may be equal to zero. Accordingly, considering a case where the characteristic response curve of the temperature sensor (338) provides an increasing voltage, $V_{TPA}$, for an increasing sensed temperature, then for sensed values of the temperature that are below the high limit temperature, $T_L$, the control voltage, $A_{OUT}$, is zero, and therefore, the current, $I_{SINK}$ may also be zero (or constant). On the other hand, for sensed values of the temperature that are equal to, or above, the high limit temperature, $T_L$, the control voltage, $A_{OUT}$, is equal to $V_{TPA} - V_{TL}$, and therefore the current, $I_{SINK}$ may be proportional to $V_{TPA} - V_{TL}$.

Figure 8B:
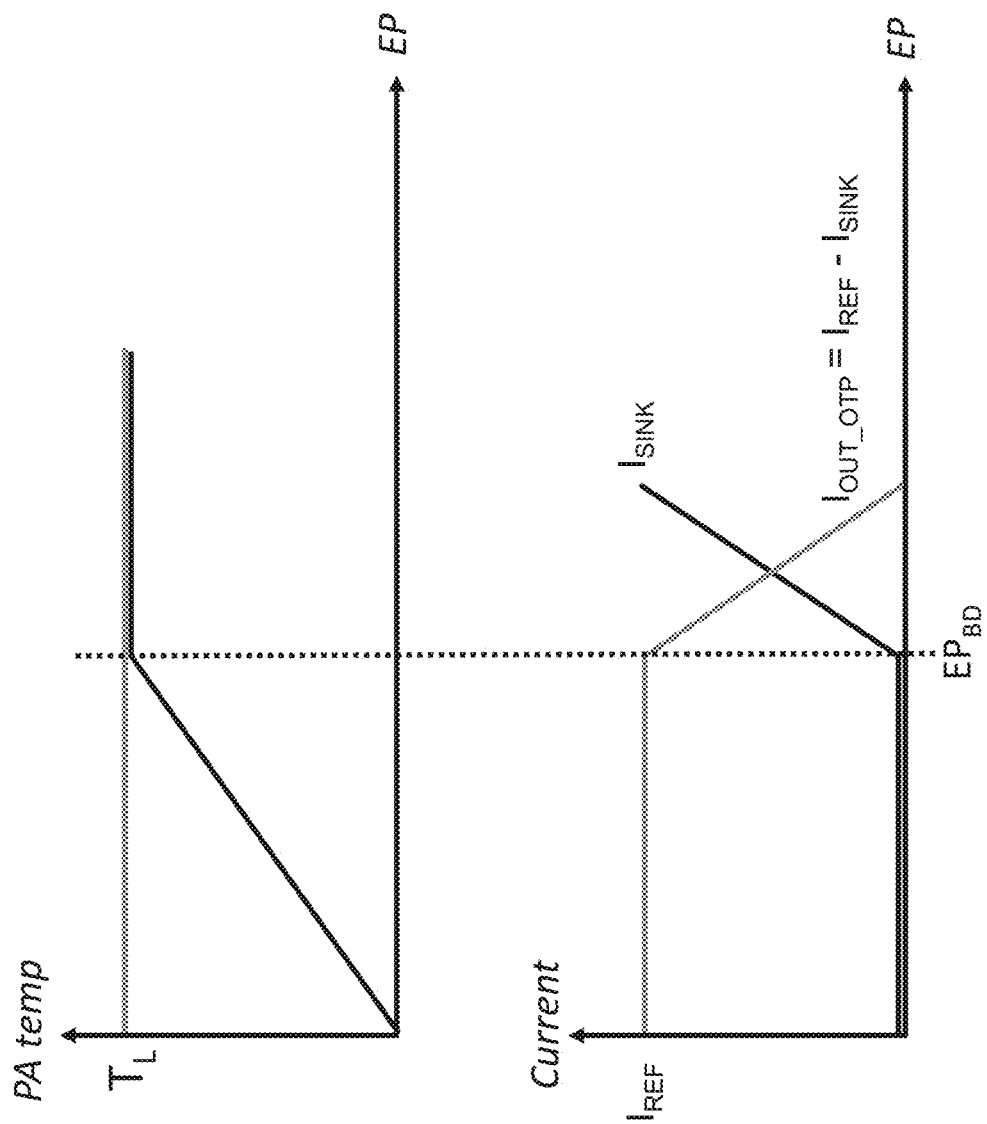
FIG. 8B shows graphs representative of operation of the over temperature protection circuit of FIG. 8A.

With continued reference to FIG. 8A, so long that there is a nonzero difference between the sensed temperature (e.g., represented by $V_{TPA}$) and the high limit temperature, $T_L$ (e.g., represented by $V_{TL}$), the current $I_{SINK}$ is nonzero. In other words, when the current $I_{SINK}$ is combined with the reference current, $I_{REF}$, as shown in the bottom graph of FIG. 8B, the resulting current $I_{OUT\_OTP}$ may limit/control the sensed temperature (e.g., PA temp) to within the high limit temperature, $T_L$, as shown in the top graph of FIG. 8B. It should be noted that by reversing coupling of the voltages, $V_{TPA}$ and $V_{TL}$, to the non-inverting and inverting terminals of the amplifier, Amp, over temperature protection for a temperature sensor (e.g., 338) having a characteristic response curve with a decreasing voltage, $V_{TPA}$, for an increasing sensed temperature can be provided. A person skilled in the art may realize that the configuration of FIG. 8A may be considered as a closed loop configuration that may control/limit the temperature of the PA (as sensed) to within the high limit temperature, $T_L$.

Figure 9A:
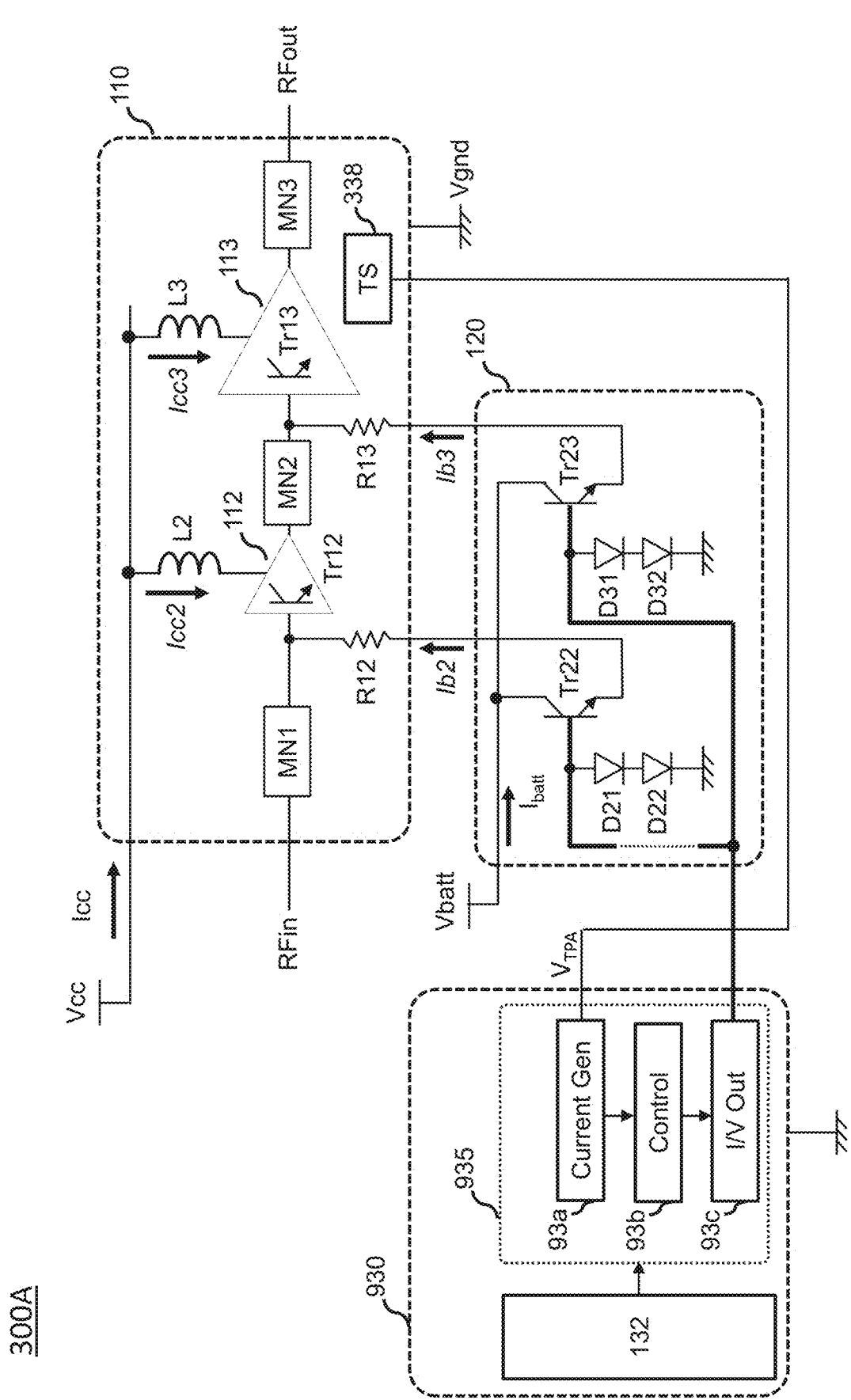
FIG. 9A shows a configuration according to an embodiment of the present disclosure based on a variation of the configuration shown in FIG. 3A.

Teachings according to the present disclosure may be extended to different schemes of controlling biasing signals to one or more PA modules for achieving the over temperature protection with soft shutdown (e.g., maintaining operation of the PA modules). For example, as shown in FIG. 9A, controlling of the collector currents (e.g., Icc2 and/or Icc3) through the PA module (110) may be provided by controlling biasing signals (e.g., voltage or current via circuit I/V Out, 93c) to the respective bases of the emitter-follower transistors (Tr22, Tr23). According to an embodiment of the present disclosure, and as shown in FIG. 9A, over temperature protection may be provided to some, and not necessarily all, of the stages (e.g., 112, 113) of a PA module (e.g., 110). For example, in the exemplary configuration of FIG. 9A, over temperature protection may be provided to the output driver stage (113) based on a temperature sensor (338) located at close proximity to the stage (113) but may not be provided to the stage (112) that may be a lower output power stage, and therefore operating at a lower nominal temperature. In the configuration of FIG. 9A, the voltage, $V_{TPA}$, from the temperature sensor (338) may be provided to a circuit block (935) that may first translate the voltage, $V_{TPA}$, via circuits (93a, 93b) that may include functionalities similar to ones described above with reference to FIG. 4A, FIG. 6A or FIG. 8A, to therefore provide a current having a shape/profile similar to the current, $I_{OUT\_OTP}$, described above with reference to, for example, any of FIGS. 4B/4C/6B/6C/8B. In turn, the current output by the circuits (93a, 93b) may be converted by the circuit (93c) to a biasing voltage or current that is provided to one or more of the respective bases of the emitter-follower transistors (Tr22, Tr23). Accordingly, as shown in FIG. 9A, the collectors of the emitter-follower transistors (Tr22, Tr23) may be tied to a (substantially constant, slow varying) supply voltage (e.g., Vbatt).

Figure 9B:
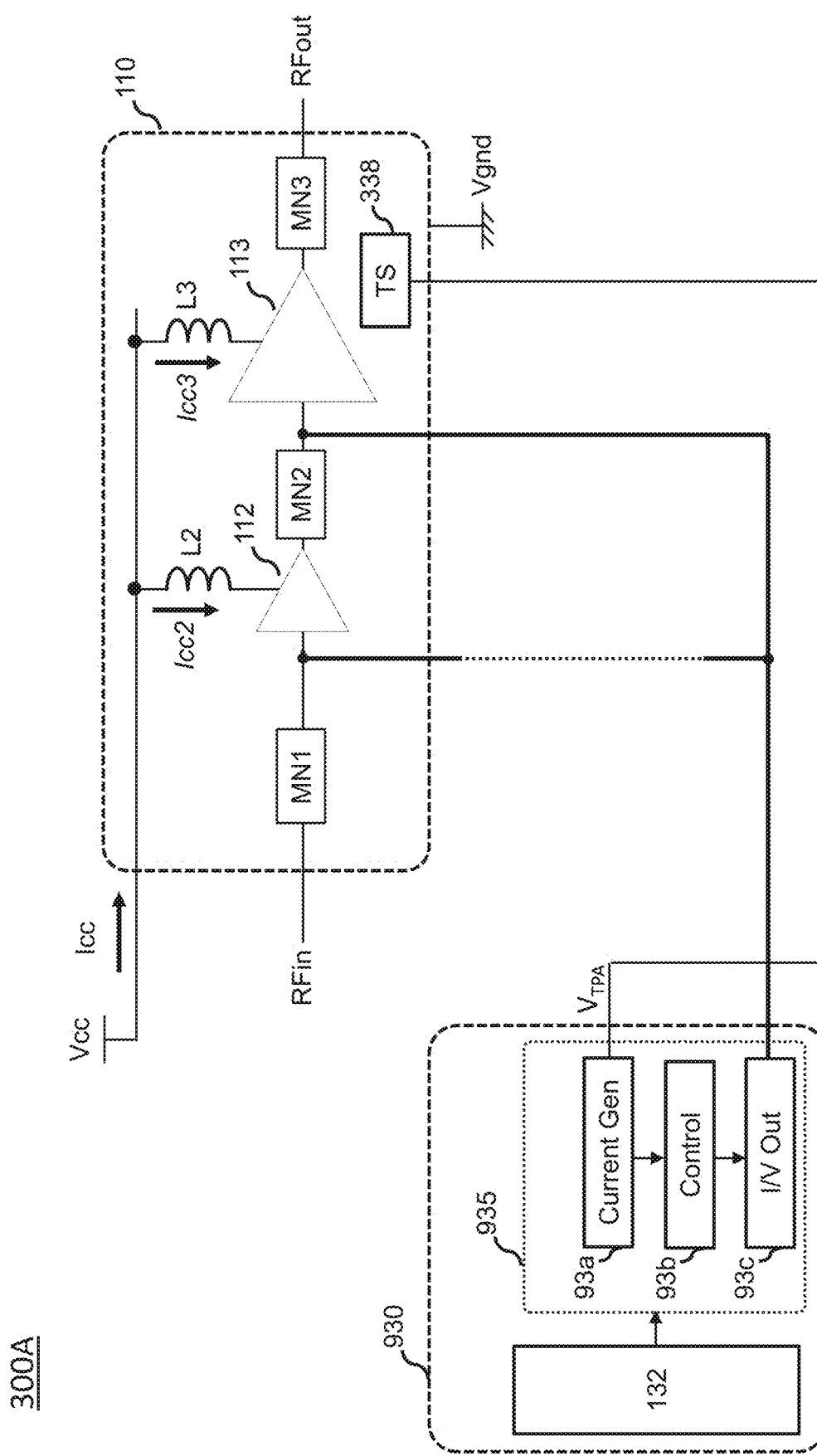
FIG. 9B shows a configuration according to an embodiment of the present disclosure based on another variation of the configuration shown in FIG. 3A.
Figure 9C:
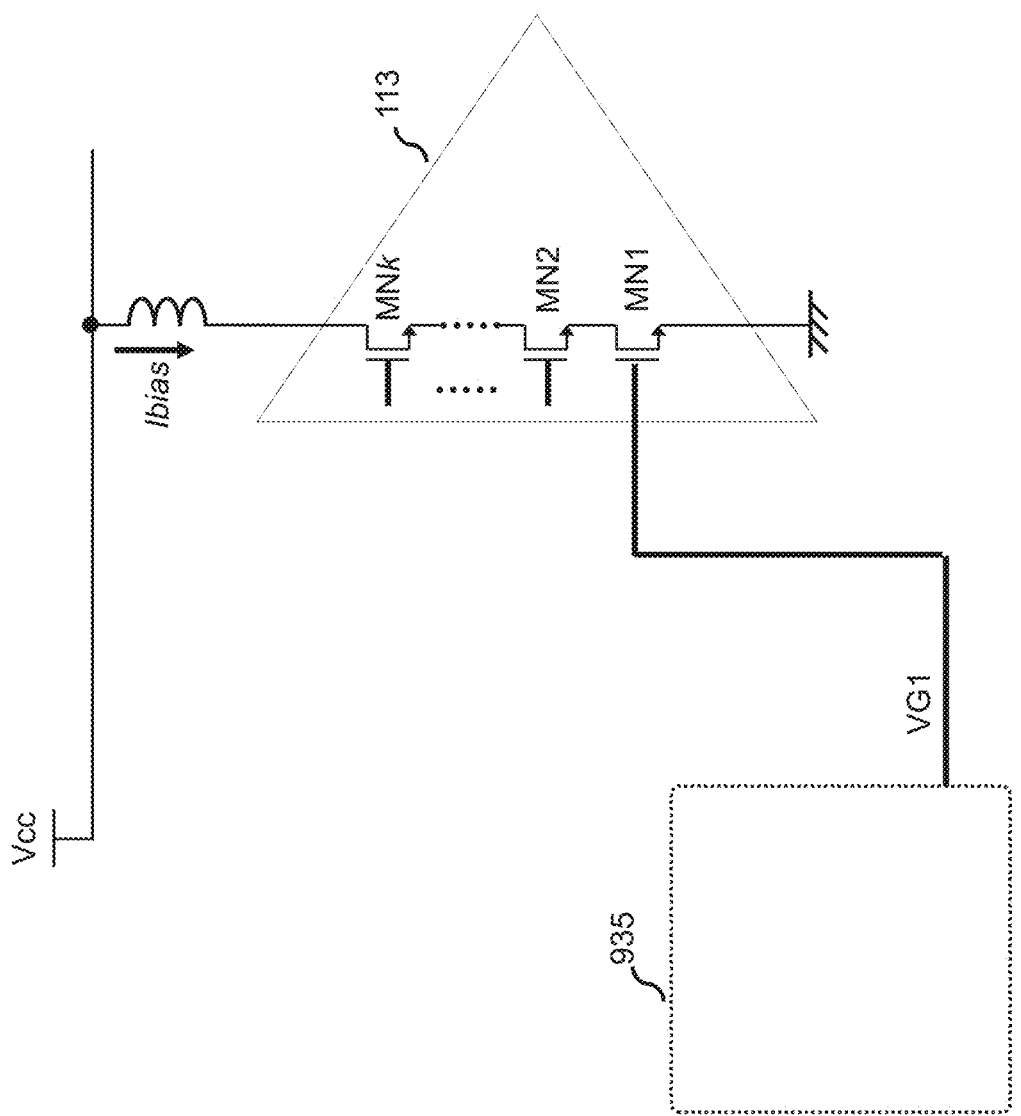
FIG. 9C shows an RF power amplifier comprising a FET transistor stack.

FIG. 9B shows a variation of the configuration described above with reference to FIG. 9A wherein the circuit block (935) directly biases one or more of the stages (112, 113) based on the voltage, $V_{TPA}$, received from the temperature sensor (338). In such configuration, the biasing signal may be a current (e.g., Ib2 or Ib3 of FIG. 9A) or a voltage (e.g., VG1 of FIG. 9C) having a shape/profile that is based on the shape/profile of the current, $I_{OUT\_OTP}$, described above with reference to, for example, any of FIGS. 4B/4C/6B/6C/8B. It should be noted that outputting of a biasing voltage by the circuit block (935) of FIG. 9B may be provided in a case where the PA module (110) includes one or more stages that includes FET transistors. This shown in FIG. 9C for a case of a stage (e.g., 113) that includes a plurality of series connected FET transistors (MN1, MN2, . . . , MNk) arranged as a cascode stack. In this case, the biasing voltage output by the circuit block (935) of FIG. 9B may be a gate voltage, VG1, that biases an input transistor of the cascode stack ((MN1, MN2, . . . , MNk) for provision of bias current, Ibias, through the cascode stack, the bias current, Ibias, determining an output power of the stage (113).

Figure 10:
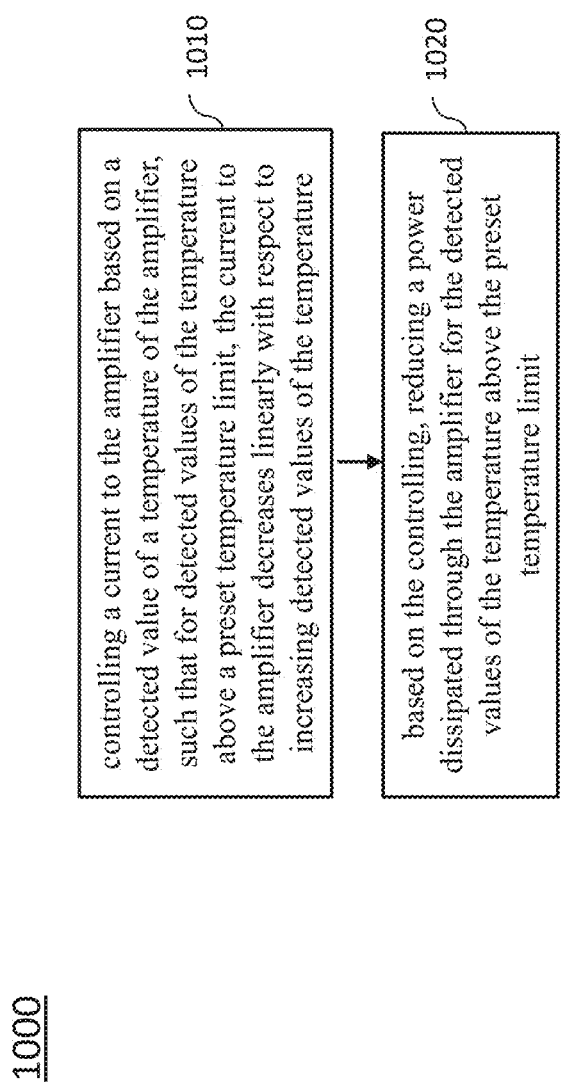
FIG. 10 is a process chart showing various steps of a method according to an embodiment of the present disclosure for controlling a current through an amplifier.

FIG. 10 is a process chart (1000) showing various steps of a method for controlling a current through an amplifier. As can be seen in the process chart (1000), the method comprises: controlling a current to the amplifier based on a detected value of a temperature of the amplifier, such that for detected values of the temperature above a preset temperature limit, the current to the amplifier decreases linearly with respect to increasing detected values of the temperature, per step (1010), and based on the controlling, reducing a power dissipated through the amplifier for the detected values of the temperature above the preset temperature limit, per step (1020).

It should be noted that the various embodiments of the PA module with over temperature protection circuit for soft shutdown according to the present disclosure may be implemented as a monolithically integrated circuit (IC) according to any fabrication technology and process known to a person skilled in the art.

Applications that may include the novel apparatus and systems of various embodiments include electronic circuitry used in high-speed computers, communication and signal processing circuitry, modems, single or multi-processor modules, single or multiple embedded processors, data switches, and application-specific modules, including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., mp3 players), vehicles, medical devices (e.g., heart monitor, blood pressure monitor, etc.) and others. Some embodiments may include a number of methods.

The term "MOSFET" technically refers to metal-oxide-semiconductors; another synonym for MOSFET is "MISFET", for metal-insulator-semiconductor FET. However, "MOSFET" has become a common label for most types of insulated-gate FETs ("IGFETs"). Despite that, it is well known that the term "metal" in the names MOSFET and MISFET is now often a misnomer because the previously metal gate material is now often a layer of polysilicon (polycrystalline silicon). Similarly, the "oxide" in the name MOSFET can be a misnomer, as different dielectric materials are used with the aim of obtaining strong channels with smaller applied voltages. Accordingly, the term "MOSFET" as used herein is not to be read as literally limited to metal-oxide-semiconductors, but instead includes IGFETs in general.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET and IGFET structures), or in hybrid or discrete circuit forms. Integrated circuit embodiments may be fabricated using any suitable substrates and processes, including but not limited to standard bulk silicon, silicon-on-insulator (SOI), silicon-on-sapphire (SOS), GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS enables low power consumption, the ability to withstand high power signals during operation due to FET stacking, good linearity, and high frequency operation (in excess of about 10 GHz, and particularly above about 20 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functions without significantly altering the functionality of the disclosed circuits.

The examples set forth above are provided to give those of ordinary skill in the art a complete disclosure and description of how to make and use the embodiments of the gate drivers for stacked transistor amplifiers of the disclosure and are not intended to limit the scope of what the applicant considers to be the invention. Such embodiments may be, for example, used within mobile handsets for current communication systems (e.g., WCDMA, LTE, 5G, WiFi, etc.) wherein amplification of signals with frequency content of above 100 MHz and at power levels of above 50 mW may be required. The skilled person may find other suitable implementations of the presented embodiments.

Modifications of the above-described modes for carrying out the methods and systems herein disclosed that are obvious to persons of skill in the art are intended to be within the scope of the following claims. All patents and publications mentioned in the specification are indicative of the levels of skill of those skilled in the art to which the disclosure pertains. All references cited in this disclosure are incorporated by reference to the same extent as if each reference had been incorporated by reference in its entirety individually.

It is to be understood that the disclosure is not limited to particular methods or systems, which can, of course, vary. It is also to be understood that the terminology used herein is for the purpose of describing particular embodiments only and is not intended to be limiting. As used in this specification and the appended claims, the singular forms "a", "an", and "the" include plural referents unless the content clearly dictates otherwise. The term "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications can be made without departing from the spirit and scope of the present disclosure. Accordingly, other embodiments are within the scope of the following claims.

The invention claimed is:

1. A circuit comprising:
   a bias circuit configured to supply a bias signal to an amplifier based on a control current;
   a temperature sensor configured to sense a temperature that includes a temperature variation that is based on external parameters to the amplifier and is independent from an output power of the amplifier; and
   a protection circuit configured to detect a temperature sensed by the temperature sensor and generate therefrom the control current,
   wherein for a detected temperature that is:
   i) lower than a preset high temperature limit, the control current is constant, and
   ii) higher than the preset high temperature limit, the control current is a linear function of the detected temperature having a negative slope with respect to increasing values of the detected temperature.

2. The circuit of claim 1, wherein
   the circuit further comprises an amplifier, and
   the bias circuit is configured to supply the bias signal to the amplifier.

3. The circuit of claim 2, wherein the detected temperature is a local temperature that is sensed by the temperature sensor that is located at close proximity to the amplifier.

4. The circuit of claim 2, wherein the detected temperature is an ambient temperature that is sensed by the temperature sensor that is located distal the amplifier.

5. The circuit of claim 2, wherein the bias circuit comprises an emitter follower transistor that is configured to supply the bias signal to the amplifier.

6. The circuit of claim 5, wherein the control current is provided to a collector of the emitter follower transistor.

7. The circuit of claim 5, wherein the control current is provided to a base of the emitter follower transistor.

8. The circuit of claim 2, wherein
   the amplifier comprises a cascode stack of series connected FET transistors, and
   a voltage that is proportional to the control current is provided to a gate of an input transistor of the cascode stack.

9. The circuit of claim 2, wherein
   the amplifier comprises a first amplification stage,
   a bias current through the first amplification stage is based on the bias signal, and
   the bias signal is configured to control power dissipation through the first amplification stage to be below a thermal breakdown limit of the first amplification stage.

10. The circuit of claim 2, wherein the control current is based on a combination of:
    a reference current that is generated by a reference current source that is independent from the detected temperature, the reference current being constant, and
    a sink current, wherein for a detected temperature that is:
    i) lower than the preset high temperature limit, the sink current is zero, and
    ii) higher than the preset high temperature limit, the sink current is a linear function of the detected temperature having a positive slope with respect to increasing values of the detected temperature, the positive slope having a same magnitude as the negative slope of the control current.

11. The circuit of claim 10, wherein the control current is based on a subtraction of the sink current from the reference current.

12. The circuit of claim 10, wherein the protection circuit comprises:
    a first current source that is configured to generate a current that is proportional to the detected temperature;
    a second current source in series connection with the first current source; and
    a first current mirror comprising a reference current leg and a target current leg, the reference current leg in series connection with one of the first current source or the second current source,
    wherein when the detected temperature is higher than the preset high temperature limit, a nonzero current that is based on a difference between a current generated by the first current source and a current generated by the second current source flows through the reference current leg of the first current mirror, else no current flows through the reference current leg, and
    wherein the sink current flows through the target current leg of the first current mirror.

13. The circuit of claim 12, wherein the current generated by the second current source is programmable and based on a value of the preset high temperature limit.

14. The circuit of claim 12, wherein a ratio of a current through the target current leg with respect to a current through the reference current leg of the first current mirror provides the positive slope.

15. The circuit of claim 14, wherein the ratio is programmable.

16. The circuit of claim 10, wherein:
    the temperature sensor is configured to output a detected temperature voltage based on a characteristic response curve of the temperature sensor; and
    the protection circuit further comprises an error amplifier having a first input terminal coupled to the detected temperature voltage and a second input terminal coupled to a reference limit voltage that corresponds to the preset high temperature limit in the characteristic response curve; and
    a first current source coupled to an output of the error amplifier, the first current source configured to generate the sink current based on a difference between the detected temperature voltage and the reference limit voltage.

17. The circuit of claim 9, wherein
    the amplifier comprises a second amplification stage that is in a cascaded arrangement with the first amplification stage, and
    a bias current through the second amplification stage is based on the bias signal.

18. The circuit of claim 2, further comprising additional one or more amplifiers and additional respective one or more bias circuits configured to supply respective bias signals,
    wherein at any given time, the circuit processes an RF signal through one only of the amplifier and the additional one or more amplifiers, and
    wherein protection circuit is further configured to generate, based on the detected temperature, the control current based on an amplifier-specific preset high temperature limit and negative slope of the control current.

19. The circuit of claim 18, wherein the detected temperature is an ambient temperature.

20. The circuit of claim 1, wherein the circuit is monolithically integrated.

21. The circuit of claim 1, wherein the circuit is monolithically integrated together with the temperature sensor.

22. A power amplifier module comprising the circuit of claim 1.

23. A method for controlling a current through an amplifier, the method comprising:
controlling a current to the amplifier based on a detected value of a temperature of the amplifier, such that for detected values of the temperature above a preset temperature limit, the current to the amplifier decreases linearly with respect to increasing detected values of the temperature, and
based on the controlling, reducing a power dissipated through the amplifier for the detected values of the temperature above the preset temperature limit,
wherein the temperature includes a temperature variation that is based on external parameters to the amplifier and is independent from an output power of the amplifier.

* * * * *